(12) United States Patent
Brohan et al.

(10) Patent No.: US 9,425,344 B2
(45) Date of Patent: Aug. 23, 2016

(54) FORMULATION OF COLLOIDAL TITANIUM-OXIDE SOLUTIONS COMPOSITION FOR COATING AND PRINTING METHODS, AND IMPROVEMENT OF THE OUTPUT AND LIFESPAN OF ORGANIC P-I-N/N-I-P PHOTOVOLTAIC CELLS

(75) Inventors: Luc René Roger Brohan, La Chapelle sur Erdre (FR); Arkadiusz Michal Karpinski, Nantes (FR); Mireille Richard-Plouet, Suce sur Erdre (FR); Solenn Berson, Chambrey (FR); Stéphane Guillerez, Lepin le Lac (FR); Mickaël Barret, Valence (FR); Jérôme Mourao, La Riviere (FR)

(73) Assignees: Centre National De La Recherche Scientifique (C.N.R.S.), Paris (FR); Université De Nantes, Nantes (FR); Commissariat a l'énergie atomique et aux énergies alternatives, Paris (FR)

( * ) Notice: Subject to any disclaimer, the term of this patent is extended or adjusted under 35 U.S.C. 154(b) by 173 days.

(21) Appl. No.: 14/345,381
(22) PCT Filed: Sep. 12, 2012
(86) PCT No.: PCT/EP2012/067829
  § 371 (c)(1),
  (2), (4) Date: Sep. 24, 2014
(87) PCT Pub. No.: WO2013/050222
  PCT Pub. Date: Apr. 11, 2013

(65) Prior Publication Data
  US 2015/0024539 A1 Jan. 22, 2015

(30) Foreign Application Priority Data
  Sep. 16, 2011 (FR) .................... 11 58275

(51) Int. Cl.
  *H01L 31/18* (2006.01)
  *C01G 23/053* (2006.01)
  (Continued)

(52) U.S. Cl.
  CPC .............. *H01L 31/18* (2013.01); *B82Y 30/00* (2013.01); *C01G 23/053* (2013.01); *C01G 23/08* (2013.01);
  (Continued)

(58) Field of Classification Search
  CPC ..... H01L 31/18; H01L 31/032; C01G 23/053; C01G 23/08; H01G 9/2031; B82Y 30/00; C09D 11/30
  See application file for complete search history.

(56) References Cited

FOREIGN PATENT DOCUMENTS

EP    1375428 A1    1/2004
GB    2473712 A     3/2011

OTHER PUBLICATIONS

Alphonse et al., "Effect of Peg on Rheology and Stability of Nanocrystalline Titania Hydrosols", Journal of Colloid and Interface Science, 2009, pp. 81-87, vol. 337.
(Continued)

*Primary Examiner* — Long Pham
(74) *Attorney, Agent, or Firm* — Thompson Coburn LLP

(57) ABSTRACT

The invention relates to a method for preparing a colloidal nanoparticle solution, including: (a) dissolving a titanium-oxide precursor, referred to as a precursor, in one or more solvents, referred to as precursor solvents; and (b) chemically converting, preferably by means of hydrolysis, said titanium-oxide precursor and said precursor solvent into a colloidal-solution solvent so as to form titanium-oxide nanoparticles that are dispersed in the colloidal-solution solvent, said colloidal solution having a dynamic viscosity of between 4 and 54 cP at 20° C. and 101,325 Pa.
The invention also relates to a colloidal titanium-oxide nanoparticle solution containing a dispersion of titanium-oxide nanoparticles in a solvent or system of solvents, the viscosity of which is between 4 and 54 cP, said solution being particularly obtainable according to the method of the invention, as well as to the uses thereof, in particular for preparing photovoltaic cells. The invention also relates to a method for generating power using a semiconductor prepared from said solution.

26 Claims, 19 Drawing Sheets

Figure 1:
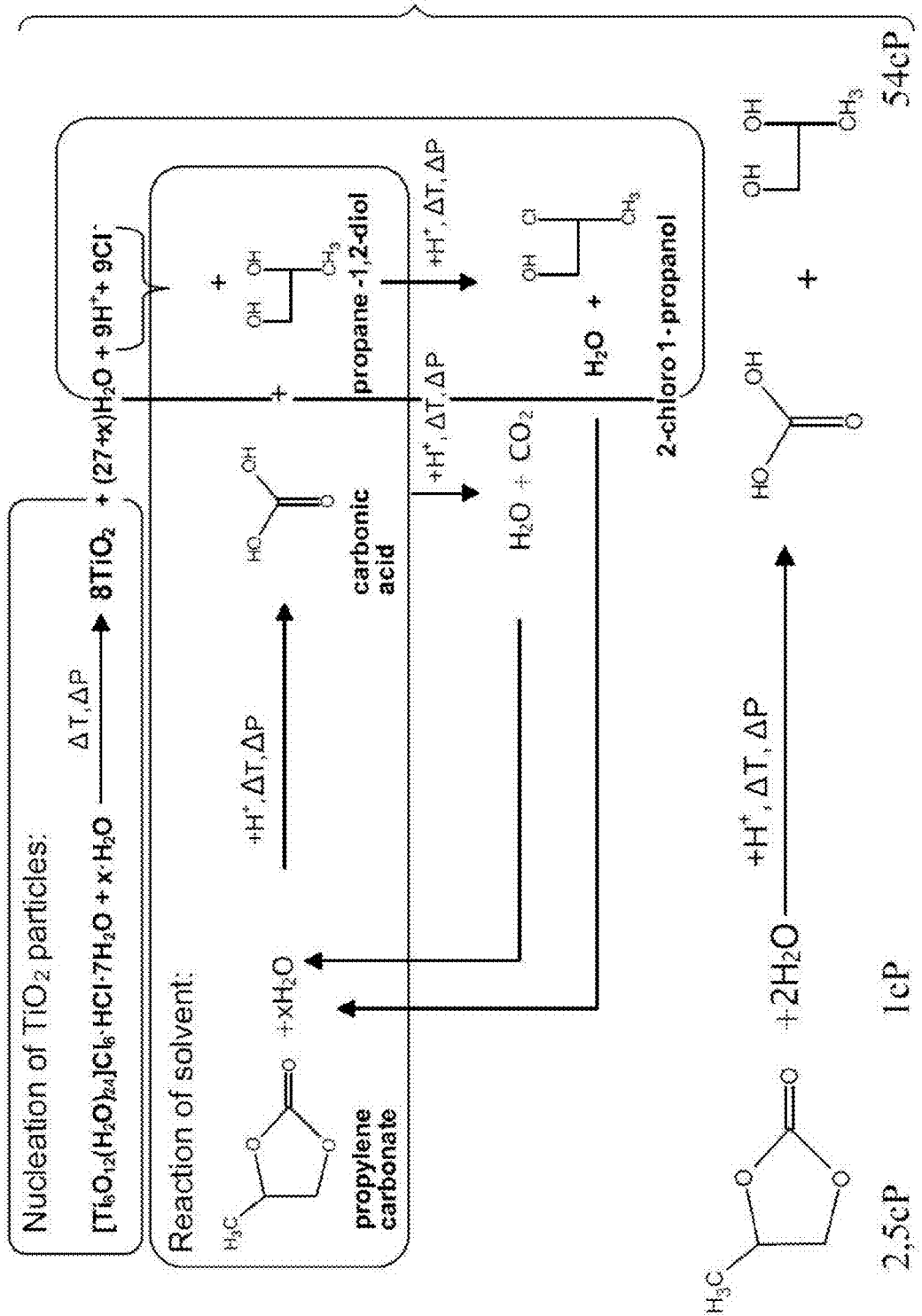

(51) Int. Cl.
 H01G 9/20 (2006.01)
 B82Y 30/00 (2011.01)
 C01G 23/08 (2006.01)
 C09D 11/30 (2014.01)
 H01L 31/032 (2006.01)

(52) U.S. Cl.
 CPC ............ C09D 11/30 (2013.01); H01G 9/2031 (2013.01); H01L 31/032 (2013.01); *C01P 2004/62* (2013.01); *C01P 2004/64* (2013.01); *C01P 2006/22* (2013.01); *C01P 2006/40* (2013.01); *H01G 9/2059* (2013.01); *Y02E 10/542* (2013.01); *Y02P 70/521* (2015.11)

(56) References Cited

OTHER PUBLICATIONS

Chu et al., "The Effects of pH, Molecular Weight and Degree of Hydrolysis of Poly (Vinyl Alcohol) on Slot Die Coating of PVA Suspensions of TiO2 and SiO2", Colloids and Surfaces A: Physicochemical and Engineering Aspects, 2007, pp. 1-10, vol. 302.

Todorova et al., "Monodispersed Titanium Oxide Particles with Nanometer Scale and Narrow-Size Distribution in Nonaqueous Media", 2 pages.

FORMULATION OF COLLOIDAL TITANIUM-OXIDE SOLUTIONS COMPOSITION FOR COATING AND PRINTING METHODS, AND IMPROVEMENT OF THE OUTPUT AND LIFESPAN OF ORGANIC P-I-N/N-I-P PHOTOVOLTAIC CELLS

CROSS-REFERENCE TO RELATED APPLICATIONS

This application is a U.S. National Stage application of International Application No. PCT/EP2012/067829, filed on Sep. 12, 2012, which claims the benefit of French Application No. 11 58275, filed on Sep. 16, 2011, both of which are incorporated herein by reference in their entireties.

The present invention concerns the field of colloidal solutions containing nanoparticles of titanium-oxide and the use thereof for printing, in particular inkjet printing, in the field of power production from solar radiation.

The present invention particularly concerns a stable colloidal solution of titanium-oxide nanoparticles for preparing a semiconductive material allowing in particular an improvement in the lifespan and/or output of solar energy conversion devices containing a said material, and photovoltaic devices in particular.

The present invention concerns the preparation of this colloidal solution, the preparation of semiconductor material, the preparation of solar energy conversion devices and the uses thereof.

The technology using crystalline silicon has dominated the photovoltaic conversion market for more than 30 years and currently represents close to 80% of marketed photovoltaic cells. However, the expansion of the photovoltaic market is chiefly limited by <<Watt peak>> cost which remains high. To reduce manufacturing costs, thin film technologies are under industrial development, these including absorbers such as CdTe (Cadmium-Telluride), CIGS (Copper-Indium-Gallium-Selenium), amorphous silicon, DSSCs (Dye-Sensitized Solar Cells) and OPVs (organic photovoltaic cells). These novel cells are beginning to arrive on the market. For example, 5 MW organic solar cells and 30 MW DSSCs became available in 2009. The yields accessible in the laboratory are in the region of 8 and 12% on small surfaces, whilst marketed devices display yields lower than 4%. Their implementation is easy since they use standard printing technologies e.g. roll-to-roll and inkjet methods, the main challenges in this sector relating to the low efficiency of these devices and their instability over the longer term.

Therefore, the invention sets out to improve the efficiency of solar energy conversion devices and/or their lifespan.

The present invention also sets out to reduce the production cost of such devices.

The preparation of titanium-oxide nanoparticles has already been investigated, in particular amorphous titanium-oxide or titanium dioxide (crystallised in anatase form). These nanoparticles are generally prepared using sol-gel methods from precursors of titanium-oxide such as titanium isopropoxide (IV) ($Ti[OCH(CH_3)_2]_4$), tetra-butyl orthotitanate ($Ti[C_4H_9O_4]$), or a solution of titanium oxysulfate ($TiOSO_4$ at about 15% by weight in dilute sulphuric acid). The solvents used differ depending on the type of precursor: generally isopropyl alcohol or butanol. Titanium complexing agents such as acetylacetone ($CH_3C(O)CH_2C(O)CH_3$) dispersed in 2-methoxyethanol ($CH_3OCH_2CH_2OH$), or ethanolamine ($H_2NCH_2CH_2OH$), or diethylamine (($CH_3CH_2)_2NH$) are added to the solutions containing the titanium precursor.

The mixture is refluxed (about 80° C.) for a few hours (1-2 h) then deposited by spin coating or electro-deposition on a transparent conductive substrate. To remove the solvents and organic complexing agents, the deposited film is subjected to a second heat treatment at 120-150° C. or 450° C. for 30 min to 1 h, depending on the type of polymer or glass substrate. Annealing at low temperature leads to an amorphous form of $TiO_x$ whilst the second allows the anatase crystallised variety of $TiO_2$ to be obtained.

The $TiO_x$ solutions prepared from alcohol precursors of titanium-oxide are costly and sensitive to the atmosphere and water. In this sol-gel method the mechanisms of hydrolysis and condensation of titanium-oxide are not controlled since they are dependent on relative humidity and temperature. Since the polycondensation kinetics of $TiO_x$ are very rapid it is practically impossible under these conditions to obtain solutions of crystallised nanoparticles having low dispersion of particle size.

The compulsory annealing step amounts to a severe limitation, in particular when applying solar cells onto polymer substrates. The performance of organic cells is closely dependent upon the type of species present on the surface of the nanoparticles and hence on the amorphous or crystallised nature of the titanium-oxide. It is important to control the size, crystallinity of the nanoparticles and the chemical composition of their surface. Deposits of amorphous titanium-oxide are obtained by spin coating, dip coating or electro-deposition and there is currently no formulation for a stable colloidal solution containing nanoparticles of titanium dioxide that is suitable for printing techniques.

It has been discovered in the present invention that it is possible to obtain colloidal solutions of titanium-oxide which are stable and can be used to prepare solar energy conversion devices, in particular via printing.

The use of a print technology further allows a significant reduction in the production costs of a photovoltaic device.

According to a first aspect, the invention concerns a method for preparing a colloidal solution of nanoparticles, characterized in that it comprises (a) the dissolving of a precursor of titanium oxide referred to as a <<precursor>> in one or more solvents referred to as <<precursor solvent>>, and (b) chemically converting, preferably by hydrolysis, the said precursor to titanium-oxide and the said precursor solvent to a colloidal-solution solvent, to form nanoparticles of titanium-oxide dispersed in the colloidal-solution solvent, the said colloidal solution having a dynamic viscosity of between 4 and 60 cP at 20° C. and 101 325 Pa.

The precursor used for the present invention is advantageously a titanium aqua-oxo chloride ($[Ti_8O_{12}(H_2O)_{24}]Cl_8$, HCl, $7H_2O$). Said precursor can be prepared following the method described in international application WO 2004/101436 from $TiOCl_2$ (titanium aquo-oxo chloride, method for its preparation; L. Brohan, H. Sutrisno, E. Puzenat, A. Rouet, H. Terrisse.—French patent to CNRS N° 0305619; European patent application EP 04 742 604.4; Japanese patent JP2006-530327 and American patent U.S. Pat. No. 7,858,064). A preparation of said precursors is also described in international application WO 03/064324 (Titanium-oxide based sol-gel polymer, L. Brohan et al.; French patent: FR0201055; European patent: EP P1470078; Japanese patent: JP 2003-563956 and American patent: US 121406760, to CNRS)

It is also possible to use any other precursor of titanium-oxide, in particular such as $TiOSO_4$, TiCl4 (particularly in an aqueous medium), TiF4, TiOF2, a titanium alkoxide in acid medium (acetic acid, $H_2SO_4$, HCl . . . ).

The conversion of the titanium-oxide precursor to titanium-oxide, preferably crystallised (preferably in anatase form) is typically performed by hydrolysis at low temperature (preferably at a temperature lower than 200° C., and generally between 20 and 200° C., more preferably between 50 and 180° C., and for example at 120° C.) in the presence of one or more solvents.

The solvent(s) of the invention are typically chosen from among those solvents allowing good dispersion of the precursor and the nucleation of titanium oxide nanoparticles.

According to one particular embodiment, at least two solvents form the solvent of the titanium-oxide precursor.

According to one particular embodiment, the <<precursor solvent>> comprises at least one first solvent and a second solvent, whereby the first solvent is consumed in full or in part by chemical conversion of the second solvent, and whereby the second solvent is converted in full or in part, preferably by hydrolysis, to a third solvent the said colloidal-solution solvent comprising at least the third solvent and optionally the first and/or second solvent.

According to one particular embodiment, the method of the invention comprises the contacting of the titanium-oxide precursor with a two-phase solvent (and preferably with one of the solvents of the two-phase solvent, the second solvent being added later) followed by the conversion of the two-phase solvent by hydrolysis (or self-hydrolysis if the two-phase solvent comprises water) to a single-phase solvent comprising titanium-oxide nanoparticles.

The first solvent is a solvent having a high dielectric constant, e.g. water. This solvent typically allows the dissolving of the precursor before the nucleation phase.

The second solvent is advantageously chosen to control the nucleation and growth of the titanium-oxide nanoparticles.

According to one embodiment, it is possible for example previously to dissolve crystals of titanium-oxide precursor in the first solvent. After dissolution, the second solvent of the titanium-oxide precursor is added and the solution left under agitation for a sufficient time to obtain good homogeneity of the whole. The mixture is placed in a chamber in suitable material (e.g. PTFE or Teflon®) which is then closed and the reactor (autoclave) can be heated for sufficient time and at sufficient temperature to convert the titanium-oxide precursor to titanium-oxide, for example at a temperature of between 80 and 150° C., e.g. at 120° C. for 48 h.

One variant of the method is to operate under reflux, in particular to reduce the reaction time. For example it is possible to use a chamber in suitable material (e.g. PTFE or Teflon®) equipped with a condenser and heating means (e.g. an oil bath) equipped with a temperature probe. The crystals previously dissolved in the first solvent, and the second solvent, are added to the chamber. The mixture is heated for sufficient time and at a sufficient temperature to convert the titanium-oxide precursor to titanium-oxide, preferably at a temperature of between 80 and 150° C. for 24 hours under continuous agitation. This variant of the method of the invention has the advantage of providing access to stable colloidal solutions having shorter preparation times (24 h instead of 48 h).

A transparent solution is obtained.

The reaction can therefore be carried out in an autoclave or reactor provided with a reflux device.

According to one particular embodiment, the second solvent is hydrolysed in an acid medium in a third solvent to generate the colloidal-solution solvent. Advantageously this hydrolysis is conducted when hydrolysing the titanium-oxide precursor as in FIG. 1 for example.

The present invention is notably based on the principle of the modification of the properties of the precursor solvent (which may be a mixture of solvents) to generate a new system of one or more solvents (colloidal-solution solvent) in which the titanium-oxide nanoparticles formed are stable. By stable is meant that 12 months after the preparation of the solution, the particle dispersion is comparable and preferably substantially identical to that of the initial colloidal solution.

The viscosity of the colloidal solution is typically controlled by halting the chemical conversion step of the precursor solvent. Therefore the adjustment of the concentration of the different reagents (in particular: titanium-oxide precursor, hydrochloric acid used in particular for hydrolysis of the titanium-oxide precursor), and of the solvents or compounds forming the precursor of the colloidal-solution solvent leads to the formation of a stable colloidal solution containing nanoparticles of titanium-oxide and particularly of titanium dioxide in anatase form.

The present invention advantageously allows controlling of the conversion kinetics of the titanium-oxide precursor and of the said solvent of the precursor so as to adjust the diameter and size dispersion of the titanium-oxide nanoparticles. It is sought to obtain nanoparticles of scarcely dispersed particle size, preferably monodisperse, and preferably having a hydrodynamic diameter of no more than 50 nm for non-agglomerated nanoparticles. Over and above 50 nm it was found by the inventors that the properties of the colloidal solution are insufficiently satisfactory for the envisaged applications and in particular for the use of a printing technique, inkjet in particular. Preference is given to nanoparticles whose hydrodynamic diameter is in the region of 5 to 10 nanometers, with a minimum value of 2 nm and maximum value of 30 nm preferably 25 nm.

The precursor solvent has a dynamic viscosity adapted for solubilising the titanium-oxide precursor (in general between 1 and 3 cP), and the dynamic viscosity of the colloidal solution of nanoparticles after hydrolysis of the titanium-oxide precursor is preferably between 4 and 54 cP, and for example between 4 and 25 cP, or further between 8 and 15 cP at 20° C. and 101 325 Pa. Measurement of viscosity is typically conducted using a SV-10 Vibro-Viscosimeter (Codemes): two gold plates are immersed in the sample; the amplitude of their vibration, calibrated in water, varies in relation to the viscosity of the fluid. The sample is placed in a glass tank on a thermostat support to conduct measurements at 20° C., the temperature at which measurements of size and zeta potential are performed.

The viscosity is particularly adapted for use of the colloidal solution by printing, and in particular inkjet printing.

The present invention advantageously provides control over viscosity during the preparation of the titanium-oxide colloidal solution. The viscosity is advantageously controlled by the stage of progress of the reaction. In particular the viscosity is controlled by halting the chemical conversion step of the precursor solvent. This control is obtained in particular via the reaction conditions and for example via the type of reagents used (precursor, solvent or other) or the concentrations thereof, the reaction temperature, pressure, reaction time, molar ratio between the reagents and/or solvents, or any combination of these parameters. This control over the reaction allows adaptation of the viscosity of the formulation to the desired application. This reaction is therefore particularly advantageous for preparing semiconductors by printing.

According to one particular embodiment, the second solvent of the precursor is chosen from among propylene carbonate and/or an alcohol having a vicinal diol such as propylene glycol, and/or a vicinal diol derivative such as 2-chloropropan-1-ol, and/or a triol having a vicinal diol such as glycerol (1,2,3-propanetriol), and/or a glycol ether or any of the mixtures thereof. Preferably the solvent of the precursor contains water and at least one second solvent listed above or any of the mixtures thereof.

According to one variant, in an acid medium, hydrolysis occurs of the propylene carbonate which is converted to propane-diol and carbonic acid. In relation to the hydrolysis conditions, the propane-diol can optionally hydrolyse in fine to 2-chloro-propan-1-ol. This is notably the case in the presence of hydrochloric acid. The forming of the colloidal solution results from double hydrolysis: that of the titanium-oxide precursor and that of the propylene carbonate.

If the viscosity of the solvents, propylene carbonate and water is low, respectively 2.5 cP and 1 cP, the reaction product (propylene glycol) has a viscosity of 54 cP at ambient temperature. This difference offers the opportunity of formulating the solution with the desired viscosity by controlling the stage of progress of the reaction. Therefore preference is given to hydrolysable or chemically convertible solvents whose viscosity is significantly different before and after hydrolysis or chemical conversion.

Therefore the present invention advantageously allows viscosity changes (increase or decrease, preferably increase) so as initially to solubilise the titanium-oxide precursor, and subsequently to form stable titanium-oxide nanoparticles, in particular through controlled modification of the viscosity of the precursor solvent.

The hydrolysis kinetics of the propylene carbonate (PC)/acid water mixture are dependent in particular on their initial proportions. For example, the precursor solvent advantageously contains water (first solvent) and propylene carbonate (PC) (second solvent), preferably with a [water]/[PC] molar ratio of between 0.1 and 1.5, more preferably between 0.2 and 1.2, and further preferably between 0.5 et 0.8.

According to one variant, the precursor of the colloidal-solution solvent contains water and propylene glycol. The [water]/[PG] molar ratio is preferably between 0.1 and 1.5, more preferably between 0.1 et 0.7.

The hydrolysis temperature is preferably between 100 and 150° C.

The surface tension of the precursor solvent is preferably between 20 and 40 mN/m.

The length of time of hydrolysis is preferably between 90 minutes and 70 hours, preferably between 8 and 60 h, at a temperature of 120° C.

The concentration of the titanium-oxide precursors is advantageously between 0.005 and 0.2 $M \cdot L^{-1}$ (i.e. 0.0185 and 0.741 g of $Ti_8O_{12}$) and preferably between 0.02 and 0.1 $M \cdot L^{-1}$ (typically [Ti]=0.027 to 0.054 $M \cdot L^{-1}$ i.e. 0.1 and 0.2 g of $Ti_8O_{12}$) in the initial solvent. The concentration is expressed in grams of titanium for practical reasons.

The formulation of the colloidal solution for inkjet printing requires precise adjustment of viscosity, generally between 8 and 15 cP at printing temperature, which can be controlled by a heating element inside the printing module.

Advantageously, the present invention also allows control over the pH of the colloidal solution of titanium-oxide. To apply printing techniques, it is advantageous to control the pH of the colloidal solutions to prevent any corrosion of the print modules. The controlled pH thus obtained is also advantageous to protect any other device from corrosion that comes into contact with the colloidal solution.

According to one particular embodiment, during the contacting of the titanium-oxide precursor with the solvent mixture (propylene carbonate-water) there occurs an intermediate formation of 1,2 propane-diol (or propylene glycol) which, by nucleophilic exchange reaction, is converted to 2-chloro-1-propanol. Here three chemical reactions take place whose kinetics differ depending on the initial reaction conditions (FIG. 1). Therefore the conversion of the titanium-oxide precursor to titanium-oxide produces hydrochloric acid, and the produced hydrochloric acid is consumed by reaction with at least one compound of the said colloidal-solution solvent, or a compound formed during the chemical conversion of the precursor solvent.

It is therefore possible to control the viscosity of the resulting colloidal solution and to neutralise the solution at a pH suitable for the envisaged uses.

According to one variant, colloidal-solution solvent is added to the precursor solvent, or a solvent that is part of the colloidal-solution solvent. It is therefore possible to add the third solvent defined above to the precursor solvent. Typically propylene glycol can be added to a water-propylene carbonate mixture. This makes it possible to obtain a significant improvement in rheological properties and to reduce the dispersity of the nanoparticles in the colloidal solution.

According to another variant, the colloidal solution of titanium-oxide nanoparticles is exposed to UV radiation to improve its solar ray absorption properties.

According to a second aspect, the invention concerns a colloidal solution of titanium-oxide nanoparticles comprising a dispersion of titanium-oxide nanoparticles in a solvent or solvent system whose viscosity lies between 4 and 60 cP at 20° C. and at 101 325 Pa.

The colloidal solution preferably comprises titanium-oxide nanoparticles in anatase form. According to the methods for preparing a colloidal solution of titanium-oxide nanoparticles, the prior methods do not allow stable colloidal solutions to be obtained containing nanoparticles of crystallised titanium-oxide (anatase). This is notably the case with the method described in international application WO 03/064324 (Titanium-oxide-based sol-gel polymer). According to this prior art method the colloidal solution obtained, depending on the initial titanium concentration and ageing time, contains nanoparticles having a hydrodynamic diameter of 1.5 nm, or two-dimensional polymer lattices of titanium-oxide. Application WO 2004/101436 does not allow a stable solution to be obtained nor crystallised nanoparticles. With the present invention it is possible to prepare a stable colloidal solution containing monocrystalline, anatase nanoparticles. The term titanium-oxide nanocrystals can be used. The nanoparticles of the invention preferably have a hydrodynamic diameter of between 2 and 50 nm and the clusters if present preferably have a hydrodynamic diameter of between 50 and 250 nm, preferably between 50 and 180 nm. Ideally, the colloidal solutions of the invention contain no (or substantially no) clusters or they are eliminated. According to some variants of the invention, the nanoparticles have a tendency to agglomerate together and hence give rise to a population of particles which is insufficiently monodisperse. This agglomeration can be avoided by treating the colloidal solution of said nanoparticles with illumination under UV radiation. Typically this treatment entails exposing the colloidal solution to UV radiation at a wavelength of 365 nm for example, for a sufficient time to eliminate any clusters present. This time is typically between 1 and 24 h.

The invention therefore particularly concerns a colloidal solution of monodisperse nanoparticles.

The colloidal solution of the invention is able to be obtained using any of the methods described in the foregoing or below, including any combination of the variants or embodiments.

The solvent of the colloidal solution is advantageously obtained as described above. In particular this solvent is obtained by hydrolysis of the precursor solvent of titanium-oxide. The term self-hydrolysis of the solvent is particularly used if it contains water since the water (at least part thereof) of the precursor solvent is used to hydrolyse the other solvent(s) of the precursor.

The colloidal solution of the invention particularly forms a sol-gel material; in particular the colloidal solution of the invention comprises or is formed of nanoparticles of titanium-oxide, in particular titanium dioxide in anatase form, dispersed in 2-chloro-1-propanol optionally containing propylene glycol and/or water.

According to a third aspect, the present invention concerns the use of a colloidal solution such as previously defined, or able to be obtained using the method of the invention, to prepare an n-type semiconductor.

According to a fourth aspect, the invention further concerns a method for preparing an n-type semiconductor layer, comprising the preparation of a colloidal solution such as previously defined, and the depositing of a layer of colloidal solution on a substrate to form an n-type semiconductor layer containing titanium-oxide nanoparticles.

Depositing is preferably carried out by printing, coating or spin coating, inkjet printing, screen printing, photo-engraving and/or by roll-to-roll technique, optionally using one or more patterns on the substrate (patterning). The use of inkjet printing allows a directly structured layer to be obtained corresponding to the desired pattern and the parameters associated with the method for controlling the characteristics of the layers obtained (thickness, underlying layer, etc.). This method also allows minimised losses of material used.

The method may comprise the depositing in solution on a substrate followed by annealing at a temperature of between 50 and 500° C. preferably between 50 and 200° C.

Typically, a colloidal solution such as previously described is deposited on a conductor or semiconductor substrate.

The addition of other co-solvents (e.g. other alcohols and/or glycol ethers) can allow an improvement in the formulations which can be used for inkjet paying heed to the characteristics of the stock solution (stability, . . . ) and the characteristic of the layers obtained (morphology, transparency, resistivity, work function, . . . ).

According to a fifth aspect, the invention concerns a photovoltaic device comprising an n-type semiconductor material able to be obtained using the previously described methods. This device is typically a p-i-n or n-i-p type photovoltaic cell, an organic transistor or light-emitting diode; the invention particularly concerns an organic photovoltaic cell.

According to a sixth aspect, the invention concerns a method for manufacturing a photovoltaic device comprising the depositing on a substrate of the colloidal solution (in typical sol-gel material form). Depending on the type of substrate, the layer of n material can be annealed at between 50 and 200° C. It has a thickness of between 10 and 200 nm for example. The active layer of the photovoltaic device is then generally deposited on the layer of n material. Heat treatment at a temperature of between 50 and 180° C. for a time of 0 to 30 minutes often allows optimisation of the morphology of the active layer. An interface layer of p-type is then generally deposited on the active layer. Heat treatment at a temperature typically of between 50 and 180° C. for 0 to 30 minutes usually allows optimisation of the performance of the device. An electrode is then typically deposited via liquid route or by vacuum evaporation on the p-type layer.

The cathode and anode are typically formed:
either of conductive materials:
metals (silver, titanium, calcium, magnesium, etc.),
or metal oxides ($Sn^{4+}$ or ITO-doped $In_2O_3$, $Al^{3+}$ or AZO-doped ZnO, indium or IZO-doped ZnO, F or FTO-doped $SnO_2$),
or inorganic/hybrid materials (material containing carbon nanotubes (CNTs) graphene),
or organic conductive materials of PEDOT type: PSS, doped polythiophenes,
or a stack of two, of ITO/Ag/ITO type.

The active layer is generally composed of an n-type semiconductor material (fullerenes, fullerene derivatives, perylene, n-type semiconductor polymers, etc.) in a mixture with a p-type semiconductor material (P3HT, polythiophene and its derivatives, copolymers of polythiophene or polycarbazole, etc).

The p-type interface layer generally comprises a p-type conductive polymer (PEDOT: PSS, doped polythiophenes, etc.) or semiconductor metal oxide ($V_2O_5$, $MoO_3$ NiO, $WO_3$).

According to one preferred embodiment, starting from the colloidal solution of the invention, the titanium-oxide layer is obtained by inkjet printing by means of a printing platform integrating print modules generating droplets of 1 to 100 pL (picoliters). Depending on the type of underlying layer, print strategies are adapted to obtain homogeneous layers of desired thickness. Similarly the concentration of titanium-oxide in the colloidal solution used is adapted in relation to the print strategy. Thermal annealing which is optionally applied is preferably similar to the annealing used for the layers obtained by coating. In general the n-layer is used on a conductor or semiconductor surface for organic or hybrid photovoltaic device, a photodiode (as for sensor applications), or light-emitting diode for conductor or semiconductor surfaces.

The colloidal solutions of the invention are stable and compatible with printing techniques.

The use of the colloidal solutions of the invention allows an increased lifespan of photovoltaic devices. The lifespan is typically at least 6500 hours with an efficiency loss lower than 15%.

The output (Power Conversion Efficiency—PCE) of the photovoltaic device of the present invention is typically 2 to 5%.

The present invention also concerns a method for producing power comprising the use of an n-type semiconductor material able to be obtained with the previously described methods, or a photovoltaic device such as previously defined for the production of power and electricity in particular from solar radiation.

Figure 2:
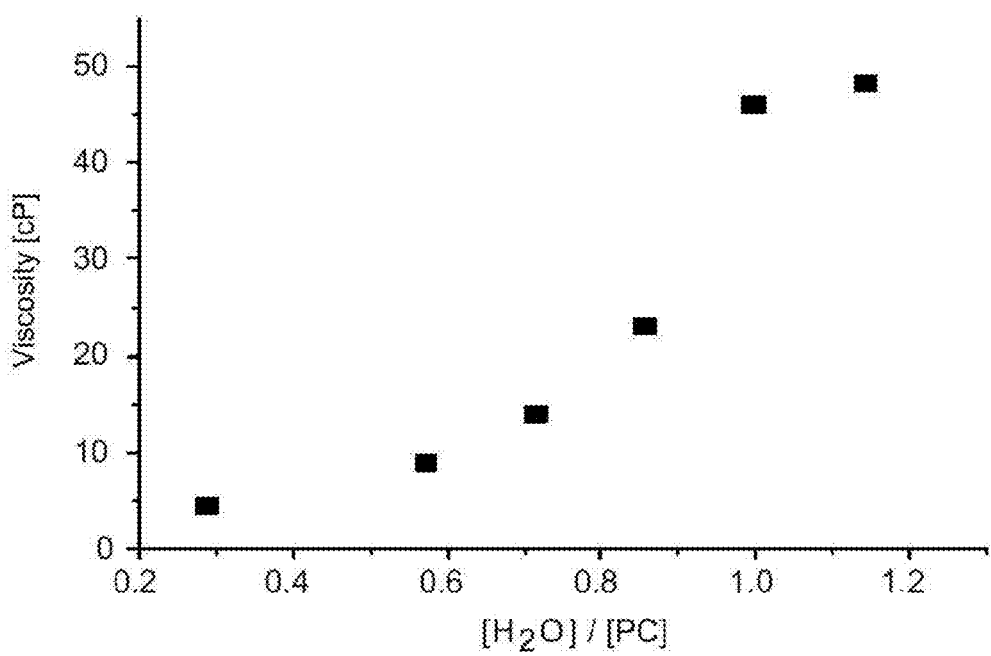
Figure 3:
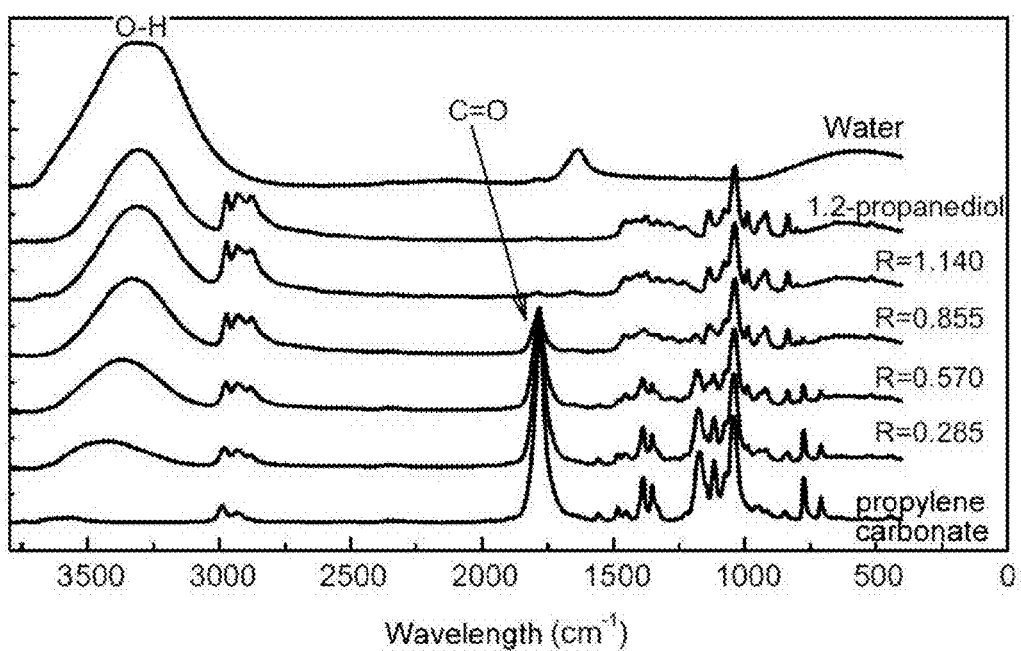
Figure 4:
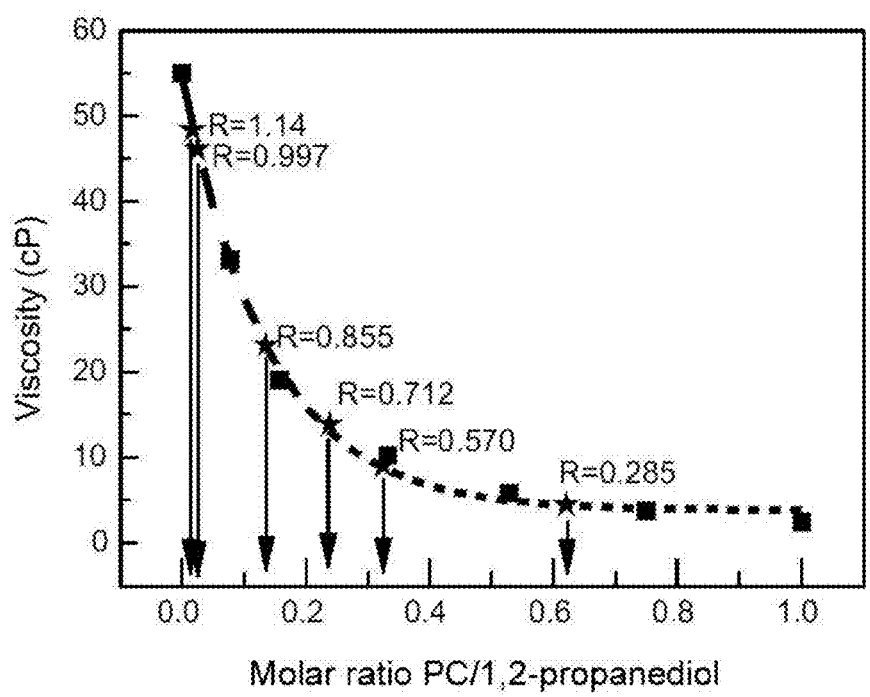
Figure 6:
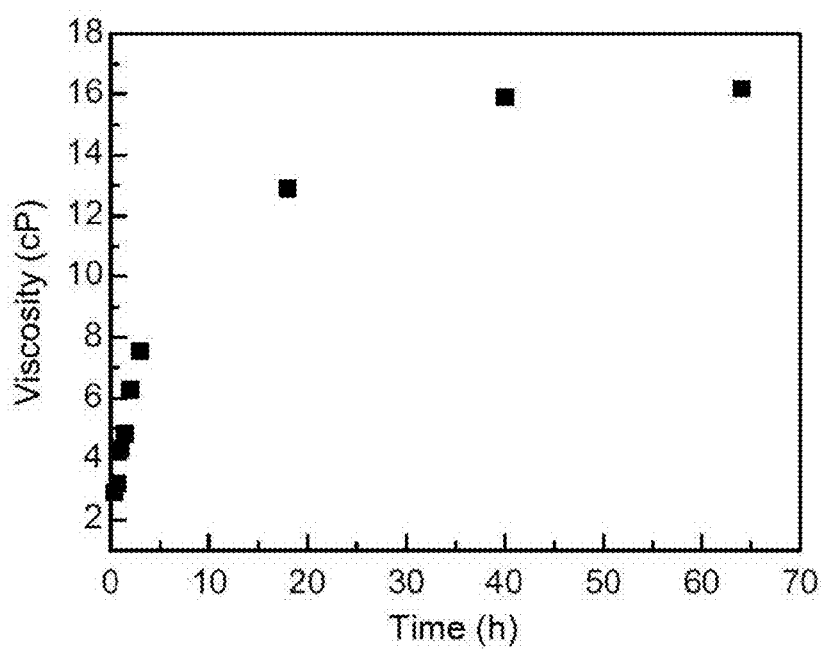
Figure 5:
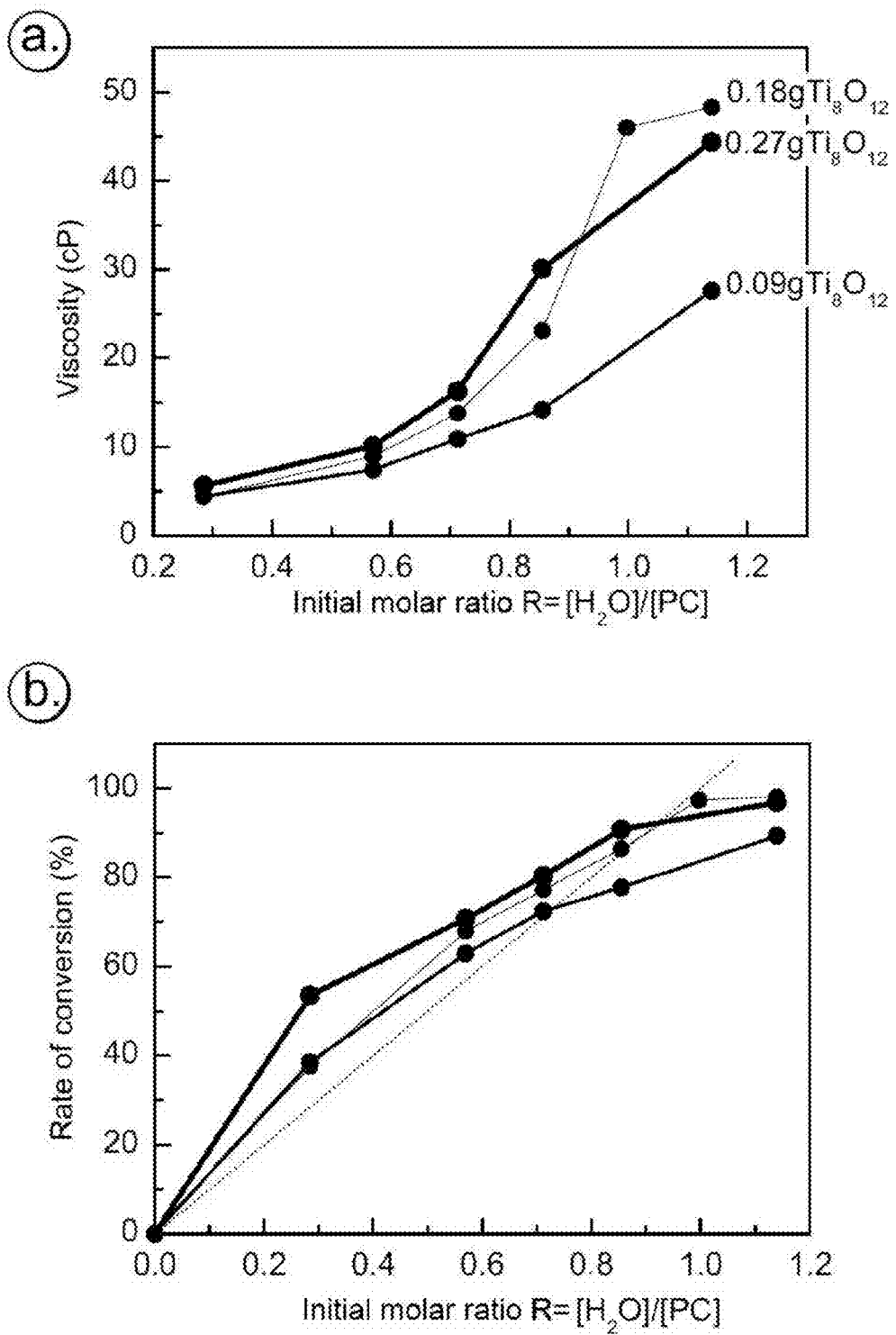
Figure 7:
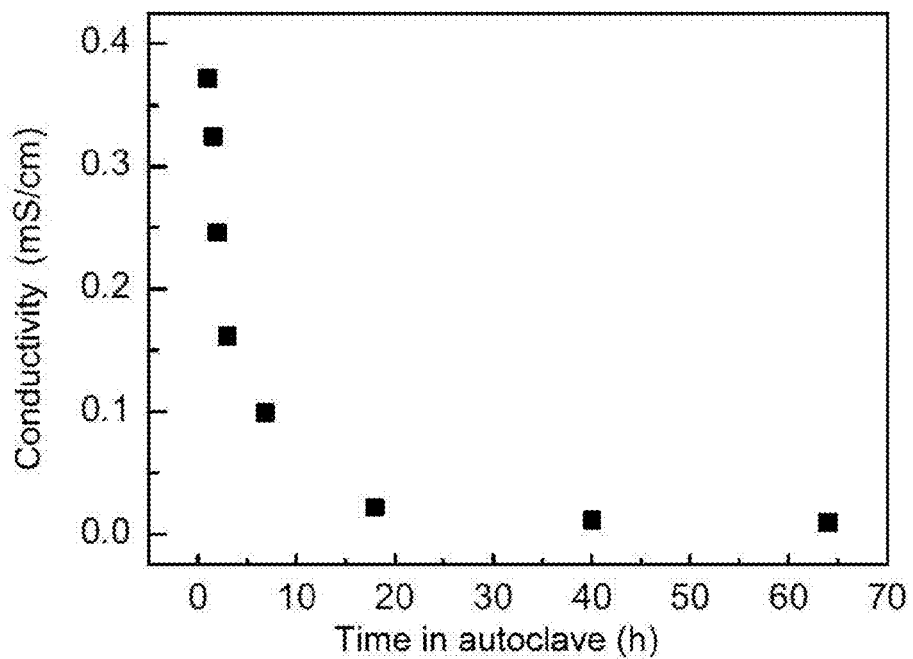
Figure 8:
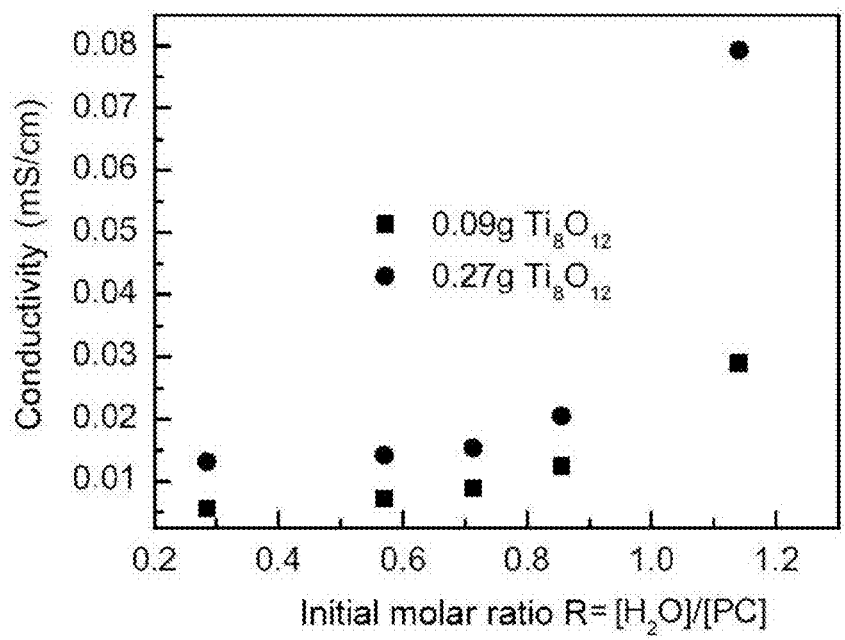
Figure 9:
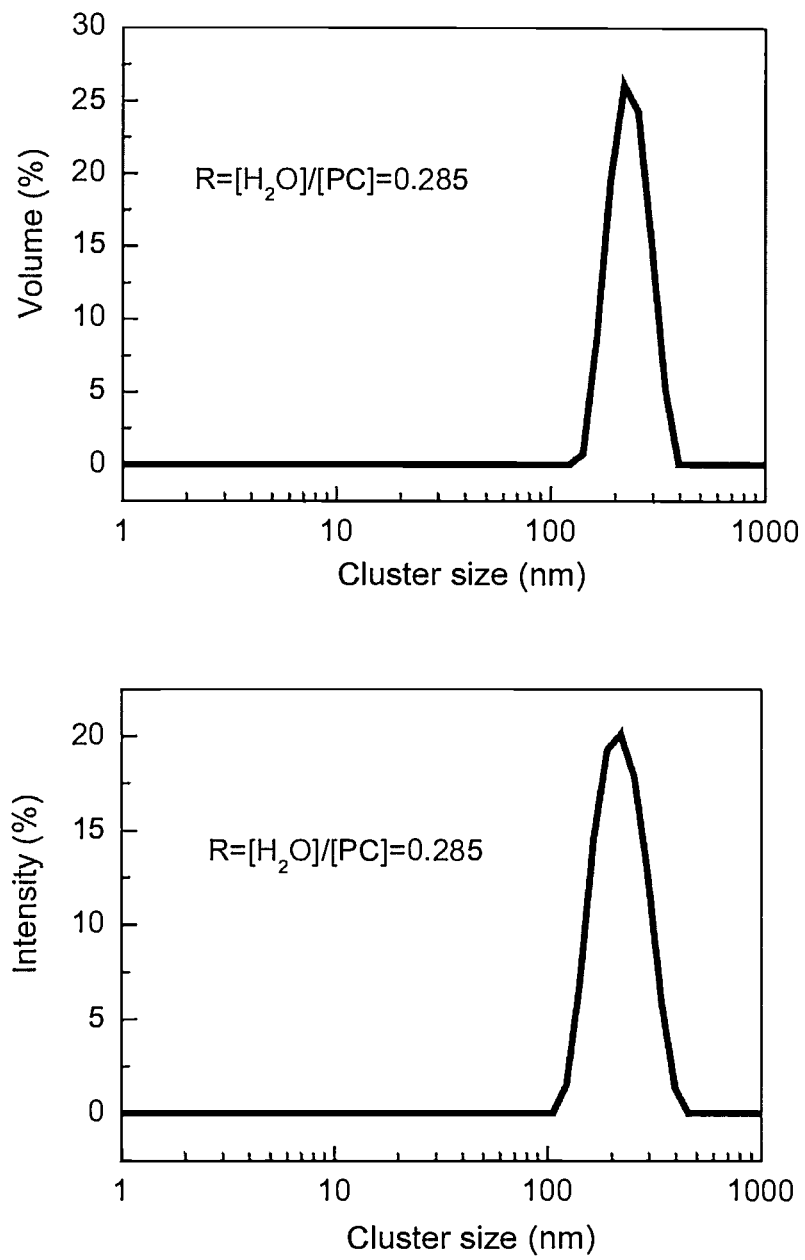
Figure 9:
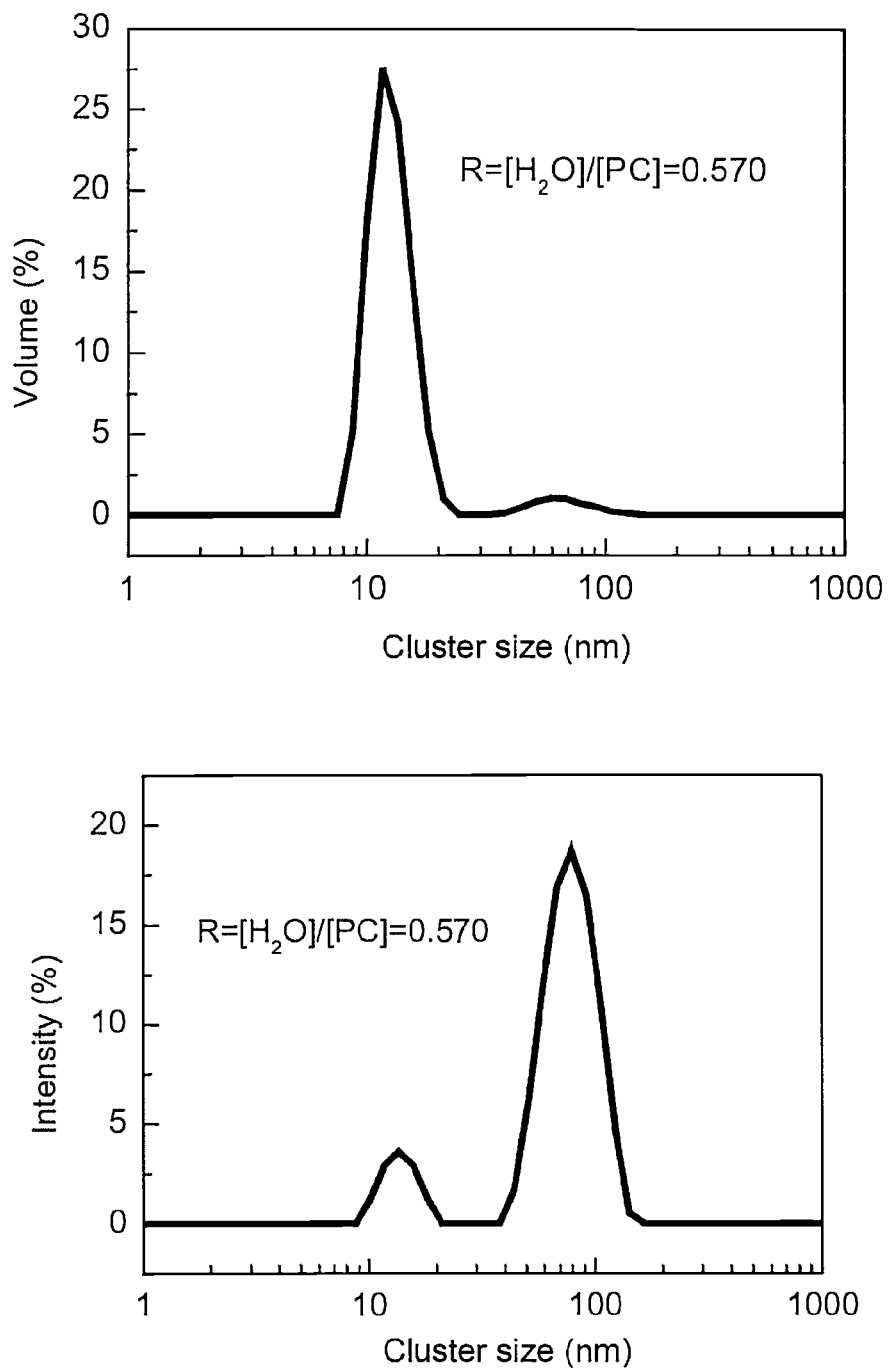
Figure 9:
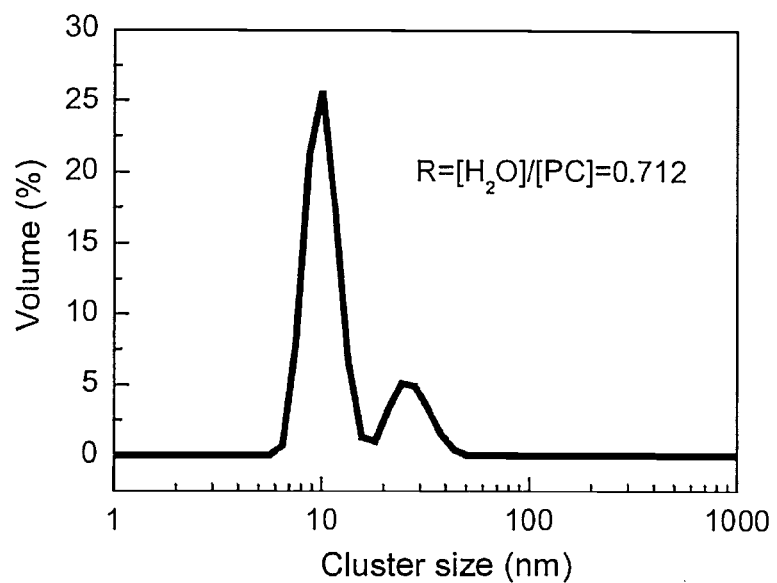
Figure 9:
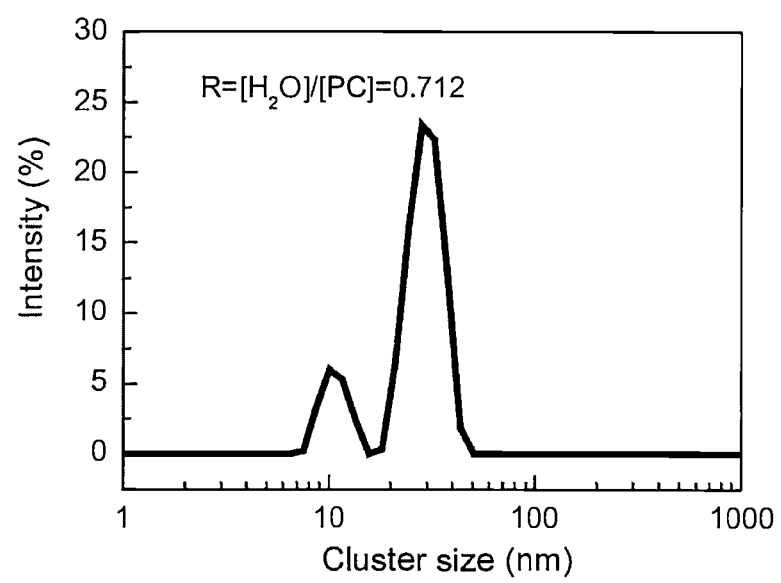
Figure 9:
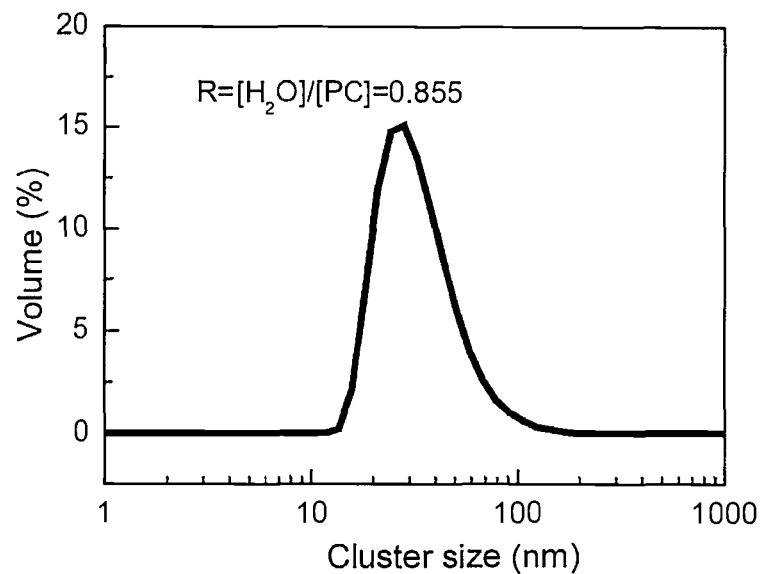
Figure 9:
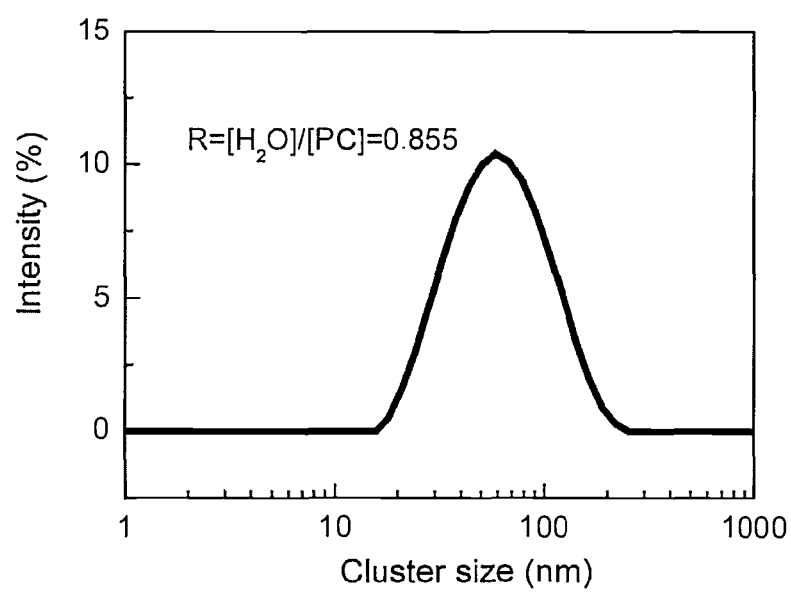
Figure 9:
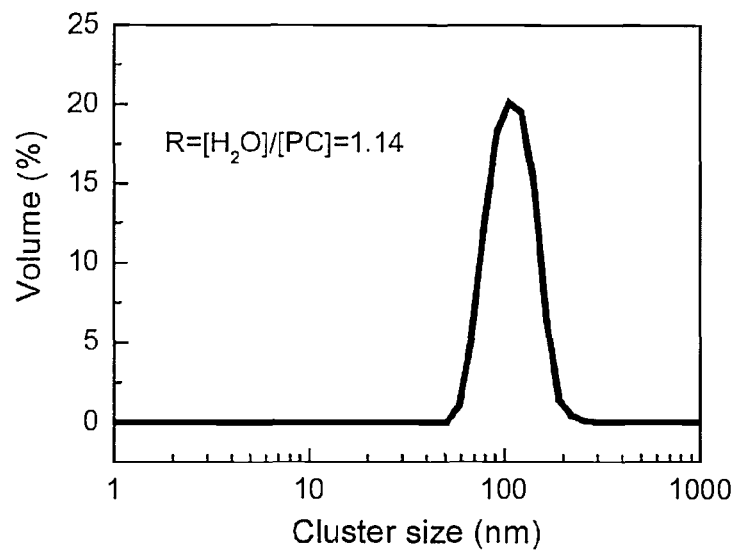
Figure 9:
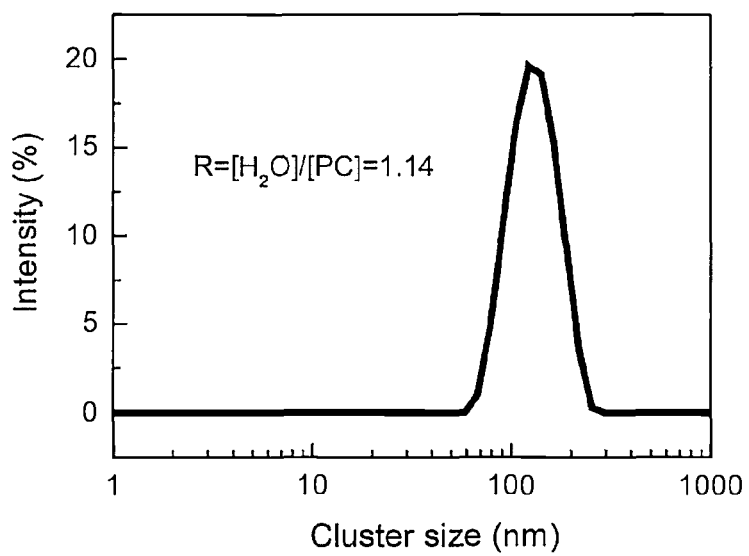
Figure 10:
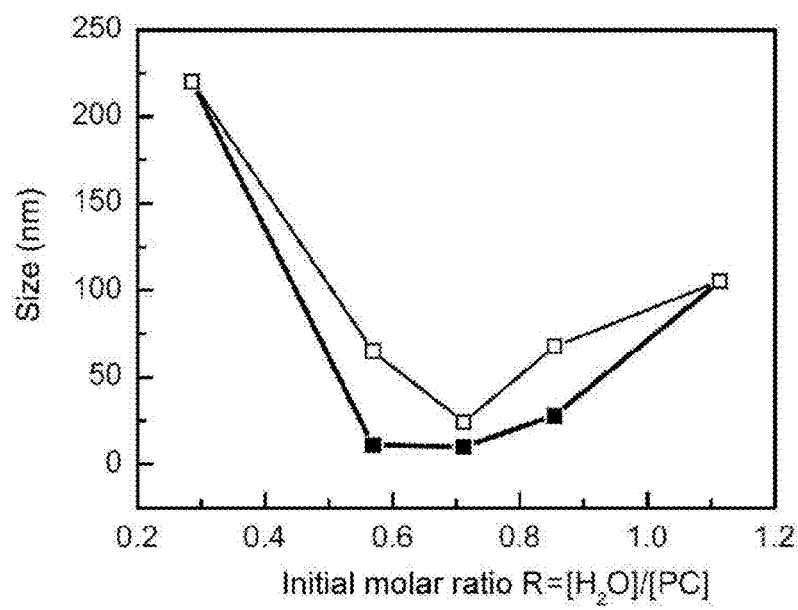
Figure 11:
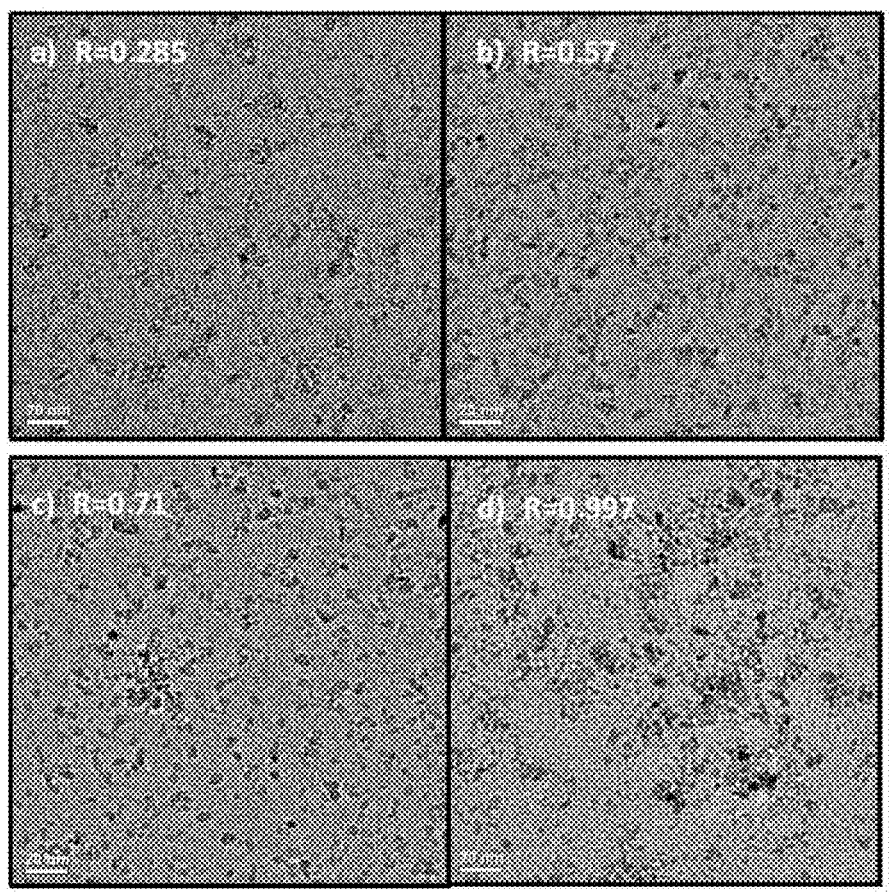
Figure 12:
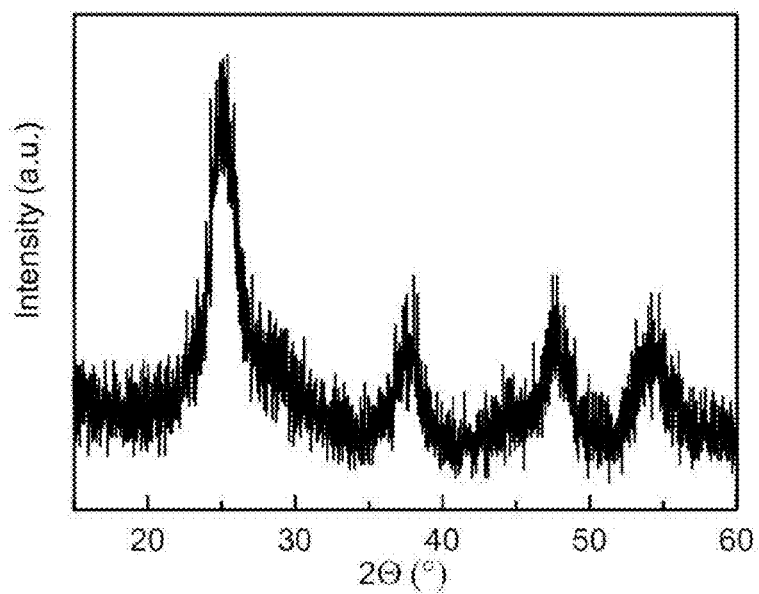
Figure 13:
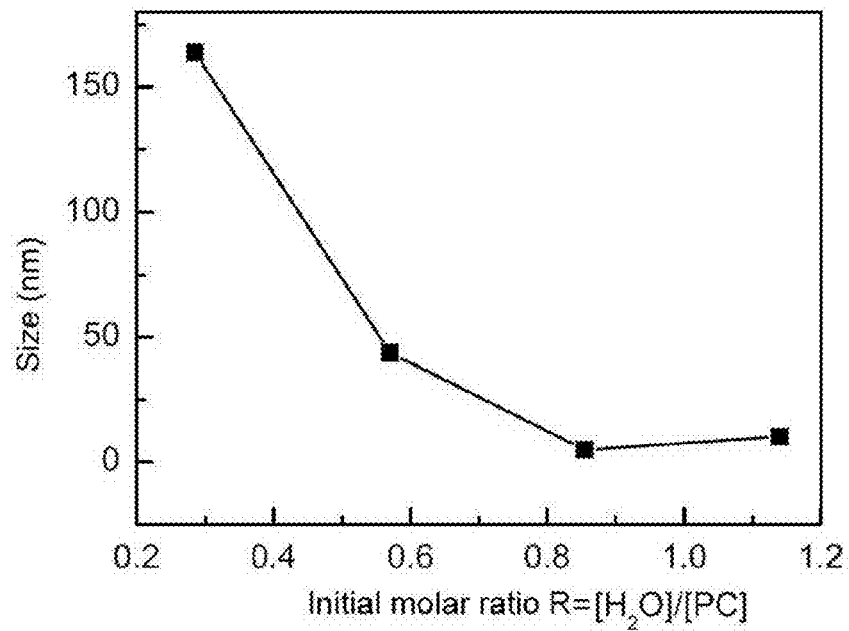
Figure 14:
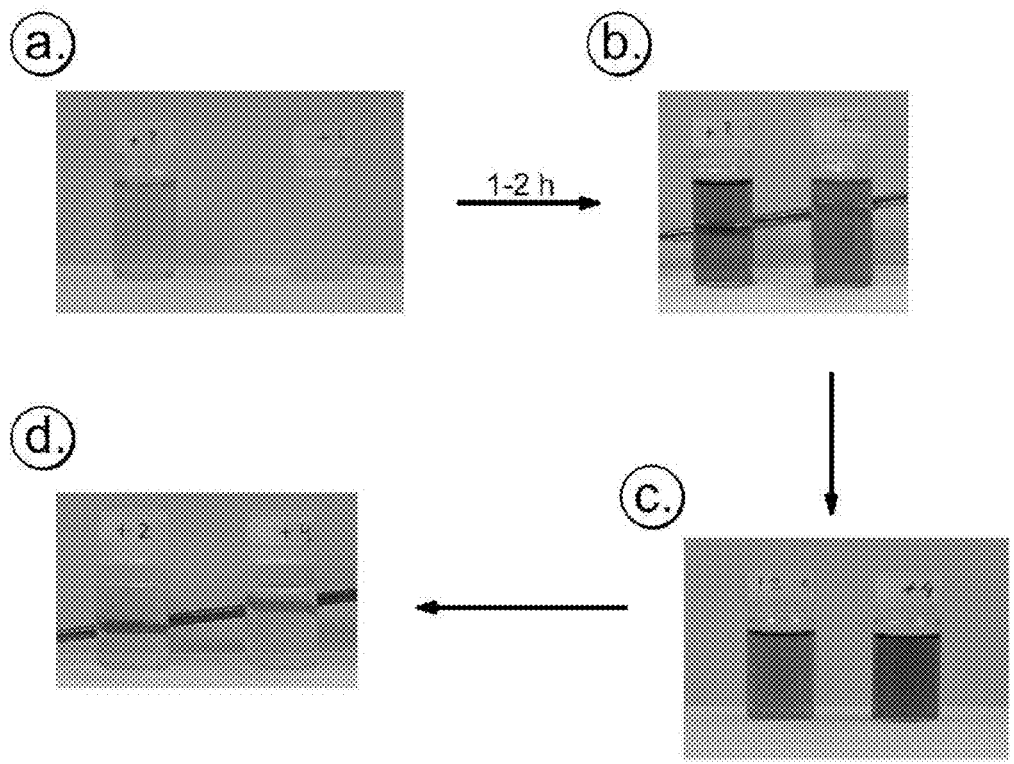
Figure 15:
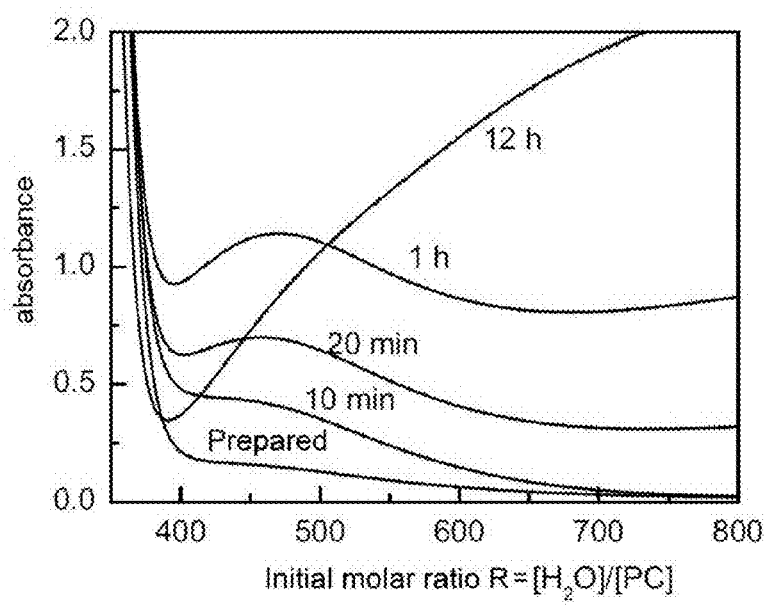
Figure 16:
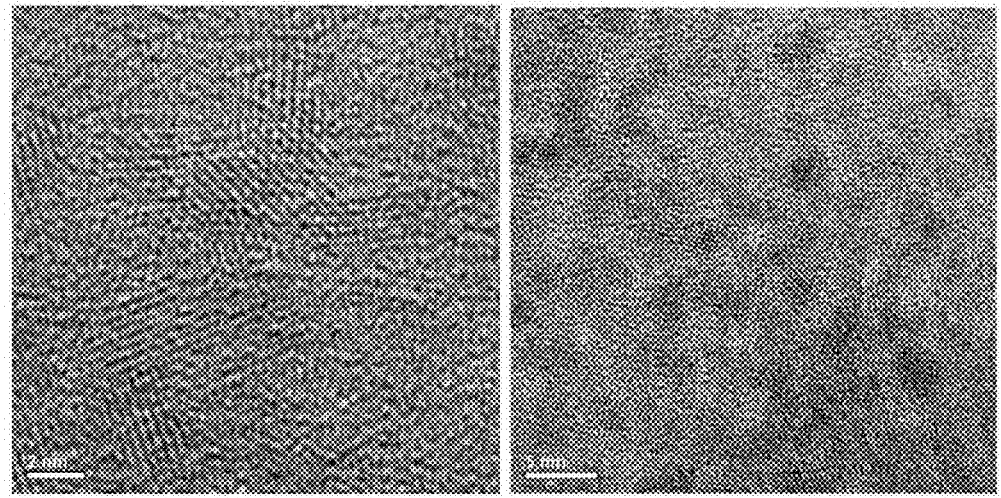
Figure 17:
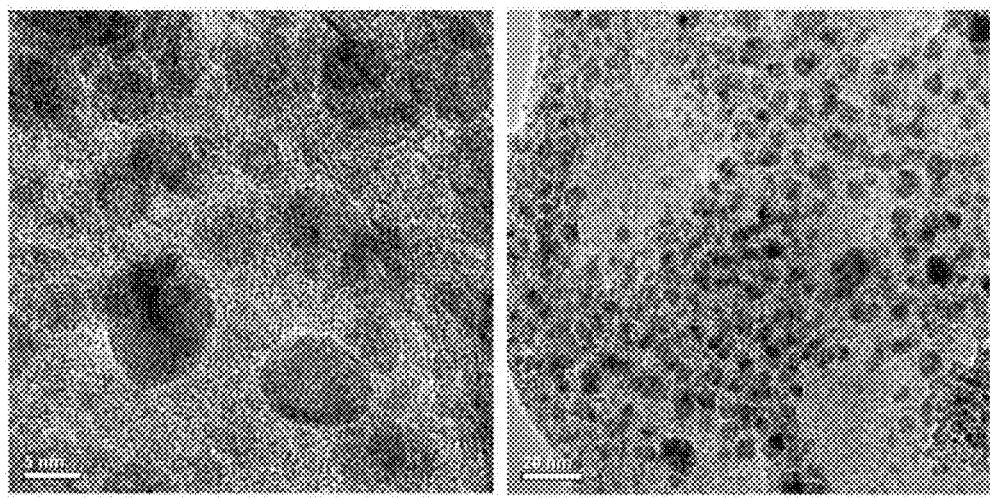
Figure 18:
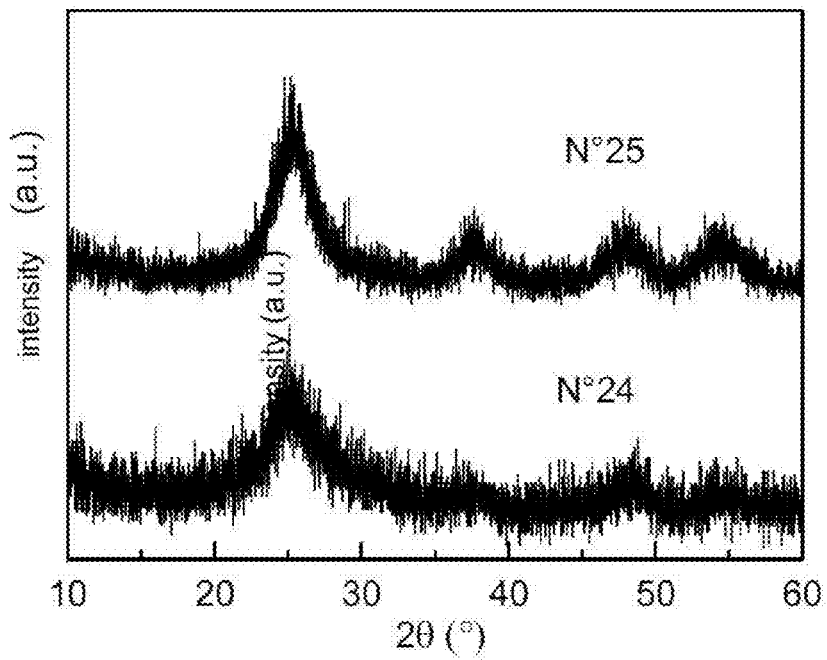
Figure 19:
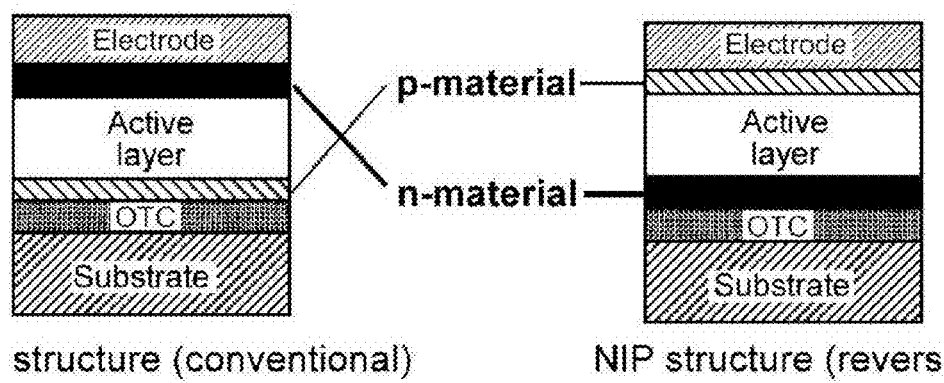
Figure 20:
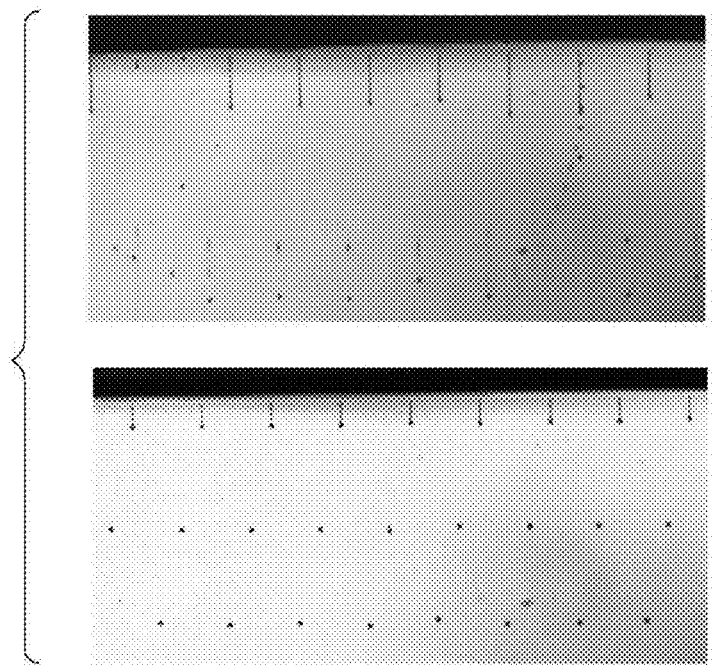
Figure 21:
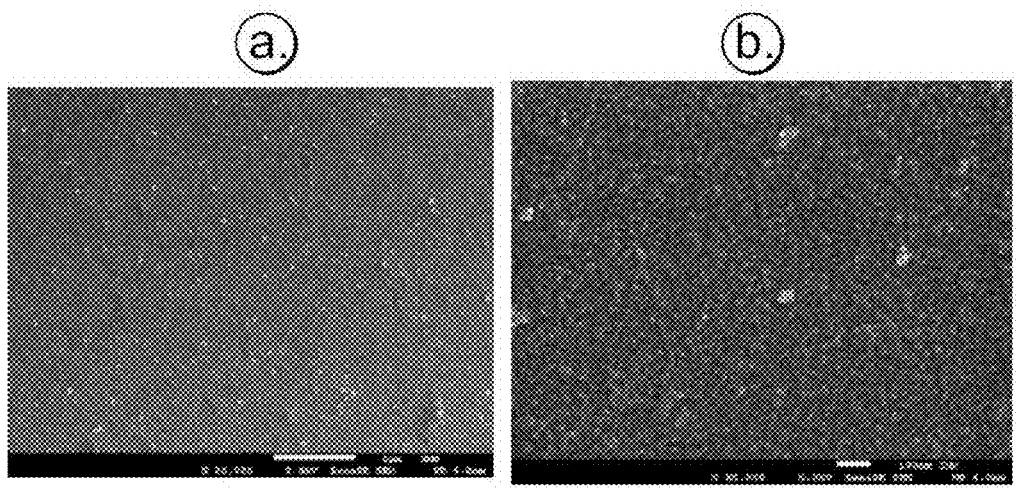
Figure 22:
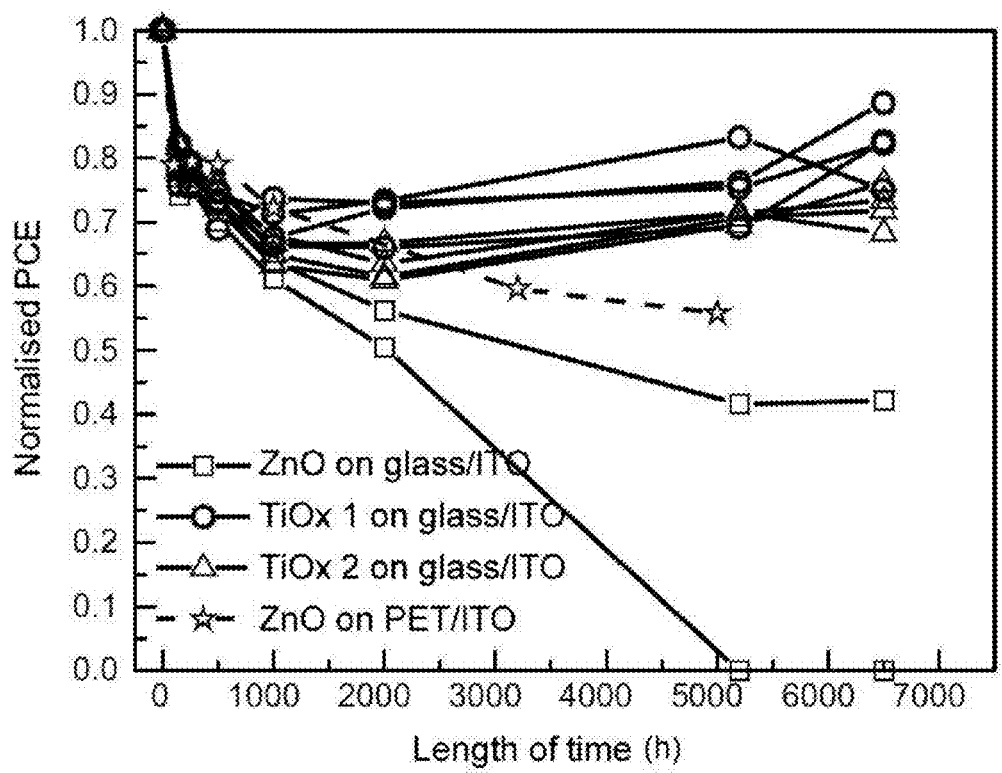
Figure 23:
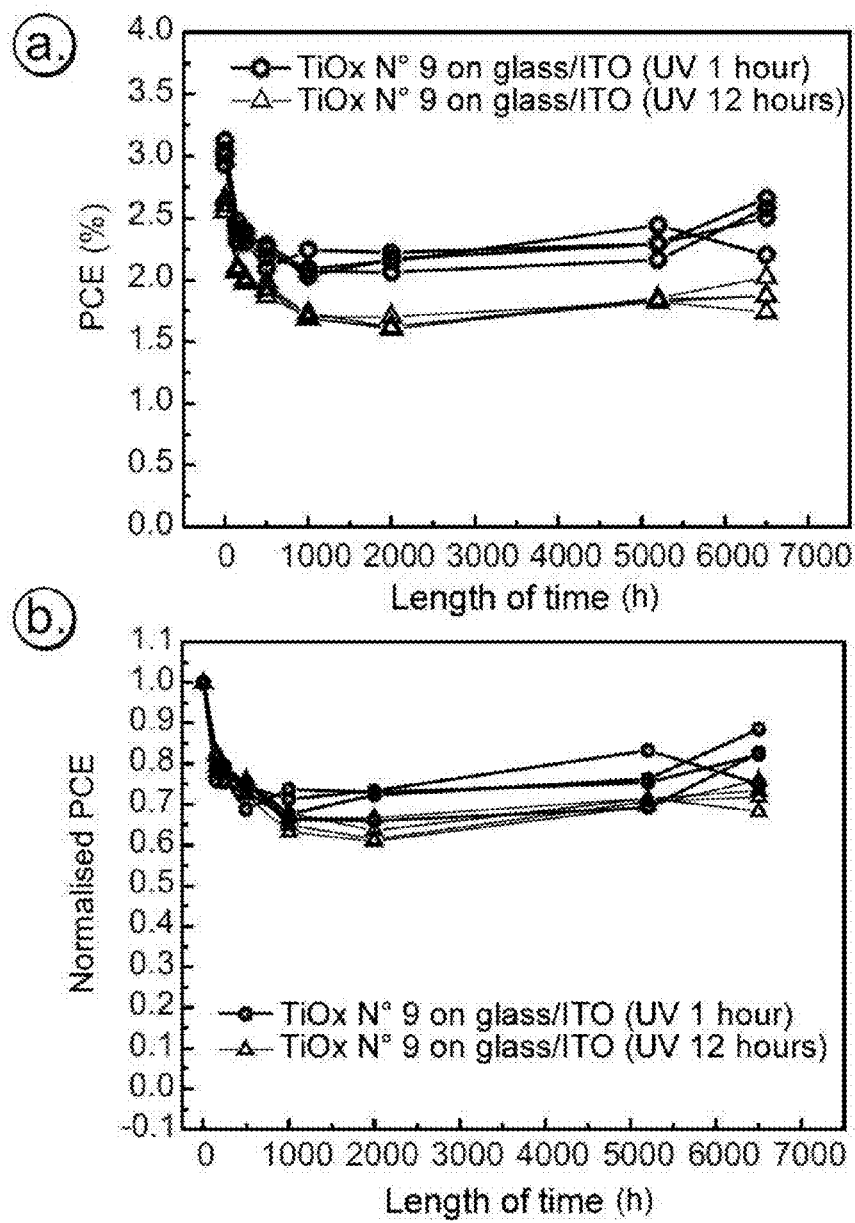
Figure 24:
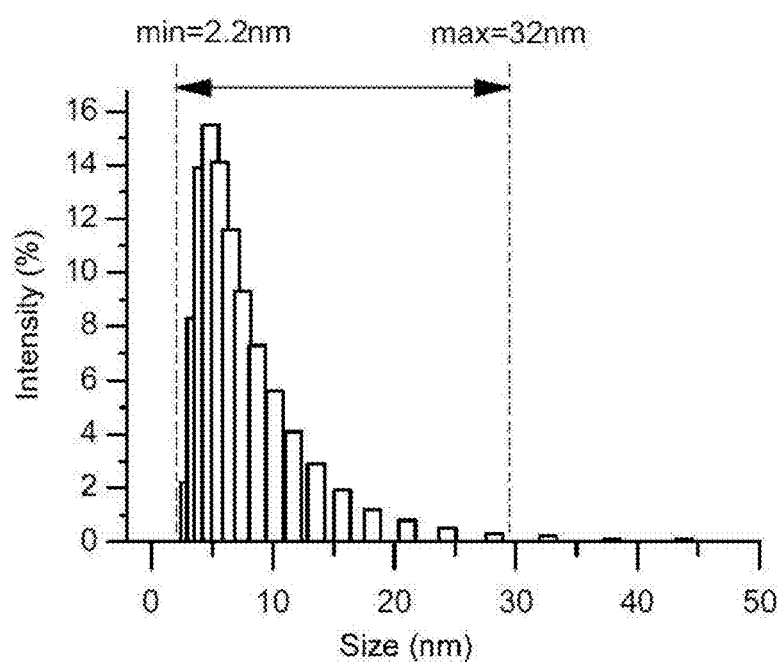

The Figures illustrate:
FIG. 1: Schematic of the synthesis of the colloidal solutions;
FIG. 2: Changes in the final viscosity of the colloidal solutions as a function of the water/propylene carbonate molar ratio;
FIG. 3: FTIR spectra of the colloidal solutions as a function of the initial molar ratio R=[H2O]/[PC];
FIG. 4: Comparison of the final viscosities of colloidal solutions and reference solvents in different molar ratios;
FIG. 5: Trend in viscosity of the colloidal solutions (a) and calculated conversion rate (b) as a function of the initial molar ratio R=[$H_2O$]/[PC];
FIG. 6: Trend in the viscosity of the solution, according to Example 2, with R=0.712 as a function of heat treatment time;
FIG. 7: Trend in conductivity of the colloidal solution, according to Example 3, with R=0.712 as a function of heat treatment time at T=120° C.;
FIG. 8: Trend in conductivity of a colloidal solution as a function of the ratio R and for different precursor concentrations;
FIG. 9: Distribution of particle diameters (in nanometers), for different molar ratios R=[H2O]/[PC] (0.285<R<1.14) of colloidal solutions, as a function of volume or diffused intensity;

FIG. 10: Diameter of the nanoparticles and clusters as a function of the initial formulation of the colloidal solutions;

FIG. 11: Transmission electron microscope images; colloidal solution diluted 100 times in ethanol, after UV illumination for 12;

FIG. 12: X-ray diffraction pattern of a powder obtained by drying (at 70° C.) the colloidal solution diluted in preparing the images of FIG. 11;

FIG. 13: Size of the particles in the solutions of Example 5 (nanometers) as a function of the initial molar ratio R;

FIG. 14: Photographs of the photosensitivity study under UV illumination (solution N° 8 on the left and solution N° 12 on the right, UV=365 nm, 1 mW/cm$^2$);

FIG. 15: UV-visible absorbance spectrum of solution N° 23, R=[H2O]/[PC]=0.855 before and after different UV illumination times; UV=365 nm;

FIGS. 16, 17: High resolution electron microscope images of solution N° 24 (R=0.171) (FIG. 16) and N° 25 (R=0.555) (FIG. 17); the colloidal solutions being diluted 10 times in ethanol;

FIG. 18: Diagram of X-ray diffraction of powders obtained by drying solutions N° 24 and 25 at 70° C.;

FIG. 19: Schematic view of different constituents of a p-i-n or n-i-p photovoltaic cell;

FIG. 20: Capture of droplets in flight on leaving an industrial printing module before and after optimisation of the ejection parameters (formulation optimised for inkjet from a colloidal solution of $TiO_x$);

FIG. 21: Scanning electron microscope image of a $TiO_x$ layer printed by inkjet on a glass/ITO substrate (steps in the manufacturing process of an OPV cell with n-i-p structure; (a) magnification ×20 000, (b) magnification ×80 000);

FIGS. 22, 23: Photovoltaic conversion efficiency of the devices produced (PCE as % or normalised) as a function of the tested time;

FIG. 24: Distribution by PCS (Photon Correlation Spectroscopy) of the size (hydrodynamic diameter in nanometers) of the particles in colloidal solution N° 9 (Example 4) before UV illumination.

Other objectives, characteristics and advantages of the invention will become clearly apparent to persons skilled in the art on reading the explanatory description which refers to examples given solely for illustration purposes and which in no way limit the scope of the invention.

The examples are an integral part of the invention and any characteristic which appears novel compared with any prior art from the description taken as a whole, including the examples, forms an integral part of the invention both generally and with regard to function.

Therefore each example has general scope.

Also, in the examples all the percentages are weight percentages unless otherwise indicated, the temperature is expressed in degrees Celsius unless otherwise indicated, and pressure is atmospheric pressure unless otherwise indicated.

EXAMPLES

Example 1

Preparation of TiOx/TiO2 Colloidal Solutions

The synthesis of the colloidal solutions is based on the conversion of the precursor $[Ti_8O_{12}(H_2O)_{24}]Cl_8 \cdot HCl \cdot 7H_2O$ to $TiO_2$ nanoparticles. The reaction is conducted at low temperature (120° C.) in the presence of a binary mixture of solvents formed of propylene carbonate and water. The selected solvents allow good dispersion of the precursor and nucleation of $TiO_2$ nanoparticles. The use of the solvent with high dielectric constant (water) allows the dissolving of the precursor before the nucleation phase. The propylene carbonate (cyclic ester) provides control over the nucleation-growth of $TiO_2$. During its reaction with the acid precursor of titanium-oxide, the formation occurs of 1,2 propane-diol (or propylene glycol), of 2-chloro-1-propanol with consumption of the water molecules and release of carbon dioxide. The adjustment of the concentration of the reagents and of the proportion of solvents (water/propylene carbonate) leads to the formation of stable colloidal solutions containing nanoparticles of $TiO_2$ (The solutions prepared in the examples are stable 12 months after their preparation i.e. the dispersion of the nanoparticles is substantially identical to the dispersion in the colloidal solutions initially prepared).

When adding the titanium precursor to the mixture of propylene carbonate-water solvents, the intermediate formation occurs of 1,2 propane-diol (or propylene glycol) which hydrolyses spontaneously in an acid medium to 2-chloro-1-propanol (FIG. 1: Schematic of the synthesis of the colloidal solutions). The forming of the colloidal solutions results from double hydrolysis: that of the precursor $[Ti_8O_{12}(H_2O)_{24}]Cl_8 \cdot HCl \cdot 7H_2O$ and that of propylene carbonate.

Example 2

Control Over the Viscosity of the Colloidal Solutions of $TiO_2$

The viscosity of the formulation of the colloidal solution for the envisaged applications, and in particular for inkjet printing, can be precisely adjusted to obtain a viscosity for example of between 8 and 15 cP at printing temperature (temperature of the print nozzles generally between 20 and 80° C.) and at atmospheric pressure.

Experimental Conditions

The colloidal solutions are prepared from $[Ti_8O_{12}(H_2O)_{24}]Cl_8 \cdot HCl \cdot 7H_2O$ as titanium precursor (performed in the laboratory by hydrolysis of an aqueous solution of $TiOCl_2$, typically having a titanium concentration of 1.5 M. $L^{-1}$ under controlled relative humidity (RH=50-60%), following the protocol described in international application WO 2004/101436 filed by CNRS (titanium aquo-oxo chloride, its method of preparation; L. Brohan, H. Sutrisno, E. Puzenat, A. Rouet, H. Terrisse), from propylene carbonate (Sigma-Aldrich 99.7%) and from Milli-Q water. The crystals of $[Ti_8O_{12}(H_2O)_{24}]Cl_8 \cdot HCl \cdot 7H_2O$ are previously dissolved in water. After dissolution, the propylene carbonate is added and the solution left under agitation for 5 minutes. The mixture is placed in a Teflon chamber (46 ml) which is then closed and the reactor (autoclave) is brought to 120° C. for 48 h. The relative quantities of reagents are specified in Table 1.

TABLE 1

Proportion of reagents and viscosity of the colloidal solutions at ambient temperature, after autoclave treatment at 120° C. for 48 h.

| Solution No | 7 | 8 | 9 | 10 | 11 | 12 |
|---|---|---|---|---|---|---|
| $Ti_8O_{12}$ (in g) | 0.18 | 0.18 | 0.18 | 0.18 | 0.18 | 0.18 |
| $H_2O$ [mL] | 1 | 2 | 2.5 | 3 | 3.5 | 4 |
| $H_2O$ [mole] | 0.056 | 0.111 | 0.139 | 0.167 | 0.194 | 0.222 |
| PC[mole] | 0.195 | 0.195 | 0.195 | 0.195 | 0.195 | 0.195 |
| R = [$H_2O$]/[PC] | 0.285 | 0.570 | 0.712 | 0.855 | 0.997 | 1.140 |
| final viscosity [cP] | 4.38 | 8.95 | 13.8 | 23.1 | 46 | 48.3 |

0.18 g of $Ti_8O_{12}$ represents a titanium concentration of: [Ti] = 0.05 M · L−1

Influence of the Proportion of Reagents

The hydrolysis kinetics of the propylene carbonate-acid water mixture are strongly dependent on their initial proportion. FIG. 2 and Table 1 show the changes in the final viscosity of the colloidal solutions as a function of the water/propylene carbonate molar ratio after a reaction time of 48 hours at 120° C.

The adjustment of the quantity of water controls the progress of the reaction and hence viscosity. The colloidal solutions therefore have viscosities of between 4.4 and 48 cP. The total hydrolysis of the propylene carbonate is written:

$$C4H6O3 + H2O => C3H8O2 + CO2$$

The FTIR spectra of the colloidal solutions (FIG. 3) change continuously as a function of the initial molar ratio $R=[H2O]/[PC]$ and are compared with the spectra of the reference solvents in FIG. 3. The hydrolysis of propylene carbonate to 1,2 propane-diol is evidenced by the disappearance of the vibration mode associated with the carbonyl group at 1780 cm$^{-1}$ and by the onset of the OH vibration mode at 3400 cm$^{-1}$ due to the formation of 1,2 propane-diol. In all cases the vibration mode at 1650 cm$^{-1}$ attributable to the presence of water is absent. With $R=[H2O]/[PC]=1.14$, the spectrum is comparable to that of 1,2 propane-diol. However, the viscosity of the solution is 48 cP and therefore remains lower than that of pure propylene glycol, 54 cP.

Since, during the hydrolysis reaction, the water molecules disappear and solely the propylene carbonate and propylene glycol subsist, it is possible to control the progress of the reaction and subsequently to control the viscosity of the colloidal solutions. FIG. 4 gives a comparison of the final viscosities of the colloidal solutions and reference solvents (propylene carbonate and 1,2 propane-diol) in different molar ratios. The stage of progress of the reaction is estimated from the reference curve (dotted) and the values for different colloidal solutions are grouped together in Table 2.

TABLE 2

Stage of progress of the reaction for different colloidal solutions inferred from equations 1 and 2.

| Solution No | 1 | 2 | 3 | 4 | 5 | 6 |
|---|---|---|---|---|---|---|
| Initial R = [H$_2$O]/[PC] | 0.285 | 0.570 | 0.712 | 0.855 | 0.997 | 1.14 |
| Final composition [PC]/[PG] | 0.623 | 0.320 | 0.228 | 0.136 | 0.026 | 0.019 |
| Rate of PC to PG conversion | 37.7% | 68.0% | 77.2% | 86.4% | 97.4% | 98.1% |

The experimental results show that by adjusting the [H2O]/[PC] ratio between 0.285 and 1.14 it is possible to control the viscosity of the colloidal solution from 4.4 cP to 48 cP at ambient temperature (20° C.).

Influence of the Quantity of Precursor

The quantity of H$^+$ protons released during the dissolution of $[Ti_8O_{12}(H_2O)_{24}]Cl_8 \cdot HCl \cdot 7H_2O$ has an influence on the kinetics and rate of hydrolysis of propylene carbonate. Three concentrations of $[Ti_8O_{12}(H_2O)_{24}]Cl_8 \cdot HCl \cdot 7H_2O$ were tested in relation to different ratios $R=[H2O]/[PC]$. The reaction temperature and time were kept at 120° C. and 48 h, respectively. FIG. 5 shows the trend in viscosity of the colloidal solutions (a) and in the calculated conversion rate (b) as a function of the initial molar ratio $R=[H_2O]/[PC]$. The dotted line represents the theoretical conversion rate and the thin, medium and thick curves represent the conversion rate for values of 0.09 g, 0.18 g and 0.27 g of $[Ti_8O_{12}(H_2O)_{24}]Cl_8 \cdot HCl \cdot 7H_2O$, respectively. The weight and molar values of the reagents and viscosity values of the colloidal solutions are grouped together in Table 3.

TABLE 3

Initial chemical composition of the reagents and viscosity of the colloidal solutions

| Solution N° | Ti$_8$O$_{12}$ (g) | H$_2$O (moles) | PC (moles) | R = [H$_2$O]/[PC] | Viscosity in (cP) (20° C.) |
|---|---|---|---|---|---|
| 1 | 0.09 | 0.056 | 0.195 | 0.285 | 4.42 |
| 2 | 0.09 | 0.111 | 0.195 | 0.570 | 7.4 |
| 3 | 0.09 | 0.139 | 0.195 | 0.712 | 10.9 |
| 4 | 0.09 | 0.167 | 0.195 | 0.855 | 14.2 |
| 5 | — | — | — | — | — |
| 6 | 0.09 | 0.222 | 0.195 | 1.140 | 27.6 |
| 7 | 0.18 | 0.056 | 0.195 | 0.285 | 4.38 |
| 8 | 0.18 | 0.111 | 0.195 | 0.570 | 8.95 |
| 9 | 0.18 | 0.139 | 0.195 | 0.712 | 13.8 |
| 10 | 0.18 | 0.167 | 0.195 | 0.855 | 23.1 |
| 11 | 0.18 | 0.194 | 0.195 | 0.997 | 46 |
| 12 | 0.18 | 0.222 | 0.195 | 1.140 | 48.3 |
| 13 | 0.27 | 0.056 | 0.195 | 0.285 | 5.63 |
| 14 | 0.27 | 0.111 | 0.195 | 0.570 | 10.1 |
| 15 | 0.27 | 0.139 | 0.195 | 0.712 | 16.3 |
| 16 | 0.27 | 0.167 | 0.195 | 0.855 | 30.1 |
| 17 | — | — | — | — | — |
| 18 | 0.27 | 0.222 | 0.195 | 1.140 | 44.4 |

0.09 g of Ti$_8$O$_{12}$ represents a titanium concentration of: [Ti] = 0.025 M · L−1
0.18 g de Ti$_8$O$_{12}$ represents a titanium concentration of: [Ti] = 0.05 M · L−1
0.27 g de Ti$_8$O$_{12}$ represents a titanium concentration of: [Ti] = 0.075 M · L−1

The aqueous solutions with low concentration of titanium precursor ([Ti]=0.025 M. L$^{-1}$) do not allow complete hydrolysis of the propylene carbonate on account of acidity that is too weak, whilst 98% of the propylene carbonate is hydrolysed when the solution contains 0.18 g of precursor ([Ti]=0.05 M. L$^{-1}$).

Influence of Heat Treatment Time

For a given temperature (120° C.), the reaction time in the autoclave is also a determinant factor for the progress of hydrolysis of the propylene carbonate. This parameter was tested with the solution in which R=0.712 (solution N° 9, Table 3). The samples were treated in an autoclave at 120° C. for different lengths of time. The change in viscosity of the solution in which R=0.712 as a function of heat treatment time is given in FIG. 6.

For a time of less than 90 minutes (1.5 h in FIG. 6) the system remains two-phase (segregation occurs of the aqueous and propylene carbonate phases) due to the low miscibility of the solvents. The solubility of water in propylene carbonate is 8.3% and that of propylene carbonate in water is 17.5% at 25° C. After 90 mn the mixture becomes homogeneous (single-phase). The 1,2 propane-diol (propylene glycol) produced during the reaction increases the mutual solubility of the solvents. FIG. 6 shows that the hydrolysis of the propylene glycol is complete after a heat treatment time of 60 hours at 120° C. and with R=0.712.

Example 3

Neutralisation of the Colloidal Solution

The implementing of printing techniques requires control over the pH of the colloidal solutions to prevent any corrosion of the printing modules. One of the steps of the method of the invention may be hydrolysis in an aqueous medium of the titanium precursor leading to the formation of hydrochloric acid as follows:

$$[Ti_8O_{12}(H_2O)_{24}]Cl_8 \cdot HCl \cdot 7H_2O + x.H_2O => 8TiO_2 + (27+x)H_2O + 9H^+ + 9Cl^-$$

However, when adding the propylene carbonate and during heat treatment at 120° C., the propylene glycol derived from the reaction consumes the HCl acid to create neutral molecules: water and 2-chloro 1-propanol. The neutralisation of the reaction can be followed by conductivity measurements. FIG. 7 gives the trend in conductivity of the colloidal solution when R=0.712 as a function of heat treatment time at T=120° C. Conductivity, which is proportional to the ion concentration, decreases continuously from 0.24 mS/cm measured after 2 hours to 0.0094 mS/cm after a treatment time of 64 hours in the autoclave. The low conductivity values measured after 15 h of heat treatment reveal that almost all the H$^+$ and Cl$^-$ ions have been consumed.

For the two tested titanium concentrations, the colloidal solutions having different solvent compositions subjected to identical heat treatments show very low conductivity values with the exception of the solution in which R=[H$_2$O]/[PC]=1.14 which has the highest conductivity and also the strongest concentration of propylene glycol (FIG. 8: trend in colloidal solution conductivity as a function of the ratio R for different precursor concentrations).

particles of colloidal solution N° 9 before UV illumination which is in the region of 5 nm. It is ascertained that the minimum particle size is 2.2 nm and the maximum size about 32 nm. The absence of any Gaussian distribution is a result of the physical detection limit of particles having a hydrodynamic diameter of less than 1 nm.

Example 5

Improvement in the Quality of the Colloidal Solutions by Adding Propylene Glycol Propylene glycol is a product from the hydrolysis of propylene carbonate. The adding of propylene glycol to the initial propylene carbonate/water composition significantly improves the rheological properties and monodispersity of colloidal solutions. The formulations of colloidal solutions studied are grouped together in Table 4.

TABLE 4

Preparation of colloidal solutions with different molar ratios R = [H$_2$O]/[PC] and addition of propylene glycol (PG), viscosity values of the formulations after autoclave treatment at 120° C. for 60 hours.

| Sol No | Ti$_8$O$_{12}$ (g) | H$_2$O (moles) | PC (moles) | PG (moles) | R = [H$_2$O]/[PC] | D = [PG]/[PC] | Viscosity (cP) at 25° C. |
|---|---|---|---|---|---|---|---|
| 19 | 0.32 | 0.056 | 0.195 | 0.039 | 0.285 | 0.2 | 5.00 |
| 20 | 0.32 | 0.111 | 0.195 | 0.039 | 0.570 | 0.2 | 8.40 |
| 21 | 0.32 | 0.167 | 0.195 | 0.039 | 0.855 | 0.2 | 18.5 |
| 22 | 0.32 | 0.222 | 0.195 | 0.039 | 1.140 | 0.2 | 24.8 |
| 23 | 0.16 | 0.167 | 0.195 | 0.039 | 0.855 | 0.2 | 17.15 |

0.16 g of Ti$_8$O$_{12}$ represents a titanium concentration of: [Ti] = 0.0445 M · L−1
0.32 g of T Ti$_8$O$_{12}$ represents a titanium concentration of: [Ti] = 0.089 M · L−1

Example 4

Diameter of the Nanoparticles and Clusters

The size of the nanoparticles and clusters contained in the colloidal solutions of different concentrations (initial [Ti]= 0.05 M·L$^{-1}$, Solutions N° 7 to 12) was measured by photo correlation spectroscopy 5 months after synthesis. The distribution of particle diameters for different molar ratios R=[H2O]/[PC] (0.285<R<1.14) of the colloidal solutions is given in FIG. 9 in volume or diffused intensity. The representation in volume is more realistic for small particles while the intensity mode is better adapted to evidence the presence of large particles in solution. The diameter of the nanoparticles and clusters in relation to the initial formulation of the colloidal solutions is given in FIG. 10. The size in relation to the initial molar ratio R=[H2O]/[PC] is given for majority populations (solid squares) and minority populations (empty squares).

The solutions in which R=0.285 and R=1.14 contain a single population of particles having a diameter larger than 220 nm and larger than 100 nm respectively, whilst those of intermediate values are formed of two types of populations. A near monodisperse solution with a diameter close to 10 nm is obtained when R=0.712. The colloidal solutions are easily diluted in an alcohol medium (Transmission electron microscope images, FIG. 11, in which the colloidal solution is diluted 100 times in ethanol, after UV illumination for 12 h) and contain nanoparticles of anatase TiO2 (X-ray diffraction diagram, FIG. 12, of a powder obtained by drying the colloidal solution at 70° C.).

FIG. 24 shows the PCS distribution (Photon Correlation Spectroscopy) of the size (hydrodynamic diameter) of the The viscosities lie between 5 and 25 cP, these values encompassing the range of interest for inkjet printing technology. In addition, since the solutions only contain a single population, they are monodisperse (FIG. 13, with solutions N° 19 to 22).

These formulations allow the adjusting also of the diameter of the nanoparticles within a large range, from 160 nm with R=0.285 and 43 nm with R=0.57, up to 5 and 10 nm for the highest R values.

Example 6

Improvement in the Absorption Properties of the Colloidal Solutions Under UV Illumination All the colloidal solutions prepared proved to be photosensitive under UV illumination (FIG. 14: solution N° 8 on the left and solution N° 12 on the right, UV=365 nm, 1 mW/cm$^2$). The solutions initially transparent or slightly opaque (a) become red-orange (b) after an exposure time of 1 to 2 h, then purple-blue (c) after extended exposure to ultraviolet light (overnight exposure or about 12 h). The change in colour occurs solely when the bottles are hermetically sealed. In contact with oxygen in the air the purple-blue solution loses its colour and becomes transparent (d). The dispersion properties of the colloids are modified after illumination. Whereas the initial solutions N° 8 and N° 12 were respectively transparent (particle diameter ~20 nm) and slightly opaque (particle diameter ~100 nm), after UV exposure overnight followed by contact with air solution N° 12 became transparent with a mean particle diameter of about 50 nm. A similar behaviour was observed for all the samples. This phenomenon results from oxidation-reduction reactions which occur under UV illumination at the titanium-oxide nanoparticle/adsorbate interface. The red colouring could be attributable to the formation of peroxo species in the presence of oxygen, whilst the blue colour results from the formation of Ti3+.

The initially transparent or opaque solutions have a characteristic absorption spectrum with an absorption front below 400 nm (FIG. 15: UV-visible absorbance spectrum of solution N° 23, R=[H2O]/[PC]=0.855 before and after different UV illumination exposure times UV=365 nm). Over the first few minutes of UV illumination an absorption band is seen at about 470 nm (the solution becomes red-orange). After extended illumination for 12 h the preceding absorption bands disappear giving way to a wide band located in the IR near-visible range responsible for the blue colouring of the solutions.

Example 7

Colloidal Solutions of Titanium-Oxide and Water/Propylene Glycol Solvents

Alternatively, colloidal solutions of TiOx/TiO$_2$ can be prepared using the precursor [Ti$_8$O$_{12}$(H$_2$O)$_{24}$]Cl$_8$.HCl.7H$_2$O and the water/propylene glycol (PG) mixture as solvent. Synthesis is carried out in an autoclave at 120° C. for 48 h. By adjusting the ratio R=[H2O]/[PG] it is possible to control the viscosity and stability of the colloidal solutions and the size of the anatase nanoparticles between 2 and 7 nm (hydrodynamic diameter). (Table 5 and FIGS. 16, 17, 18: high resolution electron microscope images of solution N° 24 (R=0.171) (FIG. 16) and N° 25 (R=0.555) (FIG. 17); for FIGS. 16 and 17 the colloidal solutions were diluted 10 times in ethanol; FIG. 18: X-ray diffraction diagram of powders obtained by drying solutions N° 24 and 25 at 70° C.).

TABLE 5

Preparation of colloidal solutions with different molar ratios R = [H$_2$O]/[PG] and viscosity values of the formulations after autoclave treatment at 120° C. for 48 hours.

| Solution N° | Ti$_8$O$_{12}$ [g] | H$_2$O [moles] | PG [moles] | R = [H$_2$O]/[PG] | Viscosity in cP (25° C.) |
|---|---|---|---|---|---|
| 24 | 0.18 | 0.056 | 0.327 | 0.171 | 36.13 |
| 25 | 0.18 | 0.166 | 0.299 | 0.555 | 24.88 |

0.18 g of Ti$_8$O$_{12}$ represents a titanium concentration of: [Ti] = 0.05 M · L−1

Example 8

Applications to Organic Photovoltaic Cells of p-i-n and n-i-p Type

The application of the formulations was validated by coating and inkjet printing techniques and integrated in the manufacturing process of n-i-p or p-i-n photovoltaic cells (FIG. 19: schematic view of different constituents of n-i-p or p-i-n photovoltaic cells).

The colloidal solutions of titanium-oxide were used to form the n-type thin semiconductor layer.

Example 9

Methods for Forming the n-Type Interface Layer

The colloidal solution of the invention was deposited on a transparent conductor or semiconductor substrate. The deposit methods used can be chosen from among spin coating, tape casting with doctor blade, printing methods (inkjet, screen printing, photo-engraving. It is also possible to use patterning of the substrate.

The use of inkjet printing allows a directly structured layer to be obtained corresponding to the desired pattern for the cell and the parameters associated with the methods for controlling the characteristics of the layers formed (thickness, underlying layer(s), . . . ) (FIG. 20: capture of droplets in flight on leaving an industrial printing module before and after optimisation of the ejection parameters (optimised formulation for inkjet from a colloidal solution of TiO$_x$; and FIG. 21: Scanning electron microscope image of a TiO$_x$ layer printed by inkjet on a glass/ITO substrate (steps in the manufacturing process of a n-i-p structured OPV cell; (a) magnification ×20 000, (b) magnification ×80 000). With this method it is also possible to minimise losses of material used.

From the previously described formulations, the TiO$_x$ layer is obtained by inkjet printing using a print platform integrating printing modules generating droplets of 1 pL to 100 pL (pL: pico-liter). Depending on the type of underlying layer, printing strategies are adapted to obtain homogeneous layers of desired thickness, and the TiO$_x$ concentration of the formulation used. The thermal annealing applied is similar to the annealing used for the layers formed by coating. The n-layer of the invention was used on a conductor or semiconductor surface of organic or hybrid solar cells, photodiodes (sensor application), light-emitting diodes.

Forming of the Photovoltaic Cells:

The prepared photovoltaic cells comprise a glass or plastic substrate (PET, PEN), coated with an ITO layer which itself is coated with an n-semiconductor oxide TiO$_x$. The latter is coated with an active film composed of a P3HT/PCBM mixture. The active layer is successively coated with a layer of PEDOT:PSS or other p-type doped semiconductor material (HTL Hole Transporting Layer) then with a silver anode. The configuration of the cell is therefore the following: substrate/ITO/TiOx/polymer+PCBM/PEDOT:PSS or other HTL/Ag.

The deposit conditions for spin coating are as follows:

Step 1: A layer of TiO$_x$ is prepared from a precursor solution by spin coating (Solution N° 9 after UV illumination for 12 h). The coating time is 60 s at 1000 rpm then 30 s at 2000 rpm. The thickness of the layer obtained is about 50 nm, depositing being performed in air, and the deposit dried over a hot plate at 150° C. for 1 h.

Step 2: The depositing of the active layer is conducted by spin coating a composition of P3HT/PCBM on the n-layer, at about 1500 rpm for 40 s then 2000 rpm for 35 s.

Step 3: An HTL layer (about 50 nm) is spin coated at 2000 rpm for 25 s then 3000 rpm for 25 s.

The cell thus prepared is then annealed in a glove box for 15 nm at 150° C.

Step 4: A silver electrode (100 nm) is deposited by vacuum evaporation.

The cells are then characterized in a glove box under a controlled atmosphere. The current-voltage (I(V)) characteristics are recorded on Keithley® SMU 2400 apparatus under AM1.5 illumination and power of 1000 W·m.

Measured Performance Levels:

The use of this structure allows performance levels to be obtained that are globally higher than those of a reference structure, thereby allowing high stability of the devices to be maintained (FIG. 22).

It can be seen in FIG. 22 that the lifespan of the photovoltaic cells produced using the colloidal solution of the invention is most significantly increased with fully satisfactory output and low efficiency loss over the tested length of time.

Table 6 summarises the photovoltaic conversion efficiency of the devices produced. The study of their ageing (flexible encapsulation, AM1.5, 100 mW·cm-2, 45° C.) is given in FIGS. 22 and 23. Compared with the reference material (ZnO), the inserting of the $TiO_x$ layer increases the lifetime of the cell and increases its output with an efficiency loss of less than 15% over 6500 h.

TABLE 6

Initial performance levels of cells produced by the 1st method (at t = 0)

| TiOx | Substrate | Thickness (nm) | Voc (mV) | Jsc (mA/cm²) | FF (%) | PCE (%) |
|---|---|---|---|---|---|---|
| $TiO_x$ 1* | glass | 45 non-continuous | 499 | 11.6 | 38.6 | 2.24 |
| $TiO_x$ 2* | plastic | 50 | 579 | 9.59 | 56.89 | 3.16 |
| $TiO_x$ 2* | glass | 50 | 600 | 11.2 | 55.22 | 3.70 |
| $TiO_x$ 2* | glass | 130 | 580 | 12.0 | 48.9 | 3.41 |
| $TiO_x$ 3* | glass | 150 | 536 | 11.9 | 44.4 | 2.82 |
| Ref. ZnO | plastic | — | 583 | 9.39 | 58.0 | 3.78 |
| Ref. ZnO | glass | — | 607 | 12.3 | 55.0 | 4.70 |

*$TiO_x$ 1: solution No 9 without UV illumination; $TiO_x$ 2: solution No 9 after UV illumination for 12 h (blue solution) $TiO_x$ 3: after UV illumination for 1 h (orange-red solution)

The invention claimed is:

1. A method for preparing a colloidal solution of nanoparticles, wherein said method comprises: (a) dissolving a precursor of titanium-oxide, the precursor, in one or more precursor solvents that comprise at least one first solvent and a second solvent, and (b) chemically converting the precursor to titanium-oxide and the precursor solvent to a colloidal-solution solvent, wherein the first solvent is consumed in full or in part by the chemical conversion of the second solvent and the second solvent is converted in full or in part to a third solvent, to form nanoparticles of titanium-oxide dispersed in the colloidal-solution solvent, said colloidal-solution solvent having a dynamic viscosity between 4 and 60 cP at 20° C. and 101,325 Pa, and (c) forming a colloidal solution of nanoparticles of titanium-oxide having a dynamic viscosity of between 4 and 60 cP at 20° C. and 101,325 Pa.

2. The method according to claim 1, wherein the dynamic viscosity of the colloidal solution of nanoparticles of titanium-oxide is between 4 and 25 cP at 20° C. and 101,325 Pa.

3. The method according to claim 1, wherein the dynamic viscosity of the colloidal solution of nanoparticles of titanium-oxide is between 8 and 15 cP at 20° C. and 101,325 Pa.

4. The method according to claim 1, wherein the titanium-oxide is in anatase form.

5. The method according to claim 1, wherein the viscosity is controlled by halting the chemical conversion step of the precursor solvent.

6. The method according to claim 1, wherein said method comprises the contacting of the titanium-oxide precursor with a two-phase solvent, followed by the conversion of the two-phase solvent by hydrolysis to a single-phase solvent comprising titanium-oxide nanoparticles.

7. The method according to claim 4, wherein the first solvent is water.

8. The method according to claim 4, wherein the second solvent is chosen from among propylene carbonate and/or an alcohol having a vicinal diol such as propylene glycol, and/or a vicinal diol derivative such as 2-chloro-propan-1-ol, and/or a triol having a vicinal diol such as glycerol (1,2,3-propanetriol), and/or a glycol ether, or any of the mixtures thereof.

9. The method according to claim 4, wherein the first solvent is water and the second solvent is propylene carbonate (PC).

10. The method according to claim 9, wherein [water]/[PC] molar ratio is of between 0.1 and 1.5.

11. The method according to claim 1, wherein the concentration of the precursor expressed in concentration of titanium is between 0.005 and 0.1 M·L$^{-1}$.

12. The method according to claim 1, wherein the conversion of the precursor to titanium-oxide produces hydrochloric acid, and the produced hydrochloric acid is consumed by reaction with at least one compound of said precursor solvent or a compound formed during the chemical conversion of the precursor solvent.

13. The method according to claim 1, wherein colloidal-solution solvent is added to the precursor solvent, or a solvent that is part of the colloidal-solution solvent.

14. The method according to claim 1, wherein the colloidal solution of titanium-oxide nanoparticles is exposed to UV radiation to improve its solar radiation absorption properties.

15. A colloidal solution of titanium-oxide nanoparticles, wherein said colloidal solution comprises titanium-oxide nanoparticles dispersed in 2 chloro-1-propanol optionally containing propylene glycol and/or water, said colloidal solution having a dynamic viscosity of between 4 and 60 cP at 20° C. and at 101,325 Pa.

16. The colloidal solution according to claim 15, wherein said colloidal solution comprises titanium-oxide nanoparticles in anatase form.

17. The colloidal solution according to claim 15, wherein said titanium-oxide nanoparticles present a hydrodynamic diameter of between 2 and 50 nm, and any clusters present a hydrodynamic diameter of between 50 and 250 nm.

18. A method for preparing a n-type semiconductor, said method comprising preparing a colloidal solution according to claim 15, and forming a n-type semiconductor.

19. A method for preparing a n-type semiconductor, said method comprising preparing a colloidal solution according to the method of claim 1, and forming a n-type semiconductor.

20. A method for preparing a n-type semiconductor layer, wherein said method comprises the preparation of a colloidal solution according to claim 1, and the depositing of a layer of colloidal solution on a substrate to form a n-type semiconductor layer comprising titanium-oxide nanoparticles, and forming a n-type semiconductor layer.

21. The method according to claim 20, wherein said depositing is performed by printing or coating, spin coating, inkjet printing, screen printing, photo-engraving and/or roll-to-roll optionally using one or more patterns on the substrate (patterning).

22. The method according to claim 20, wherein said method comprises the depositing of the colloidal solution on a substrate, followed by annealing at a temperature of between 50 and 500° C.

23. A method for manufacturing a photovoltaic device, wherein said method comprises the preparation of a n-type semiconductor layer according to claim 20, and forming a photovoltaic device comprising said n-type semiconductor layer.

24. The method according to claim 23, wherein said photovoltaic device forms a photovoltaic cell of p-i-n or n-i-p type, an organic transistor or a light-emitting diode.

25. A method for producing power wherein said method comprises producing power from solar radiation with a n-type semiconductor material obtained according to claim 20.

26. A method for producing power wherein said method comprises producing power from solar radiation with a photovoltaic device manufactured according to claim 23.

* * * * *